United States Patent [19]

Fujiwara et al.

[11] Patent Number: 5,136,149
[45] Date of Patent: Aug. 4, 1992

[54] METHOD OF FOCUSING OPTICAL HEAD ON OBJECT BODY AND AUTOMATIC FOCUSING DEVICE FOR OPTICAL INSPECTION SYSTEM INCLUDING TILT DETECTION

[75] Inventors: Nariaki Fujiwara; Masahiro Horie, both of Kyoto, Japan

[73] Assignee: Dainippon Screen Mfg. Co., Ltd., Kyoto, Japan

[21] Appl. No.: 684,746

[22] Filed: Apr. 15, 1991

[30] Foreign Application Priority Data

Apr. 23, 1990 [JP] Japan ................ 2-107071

[51] Int. Cl.⁵ ............................................. G01J 1/20
[52] U.S. Cl. ............................ 250/201.5; 369/44.32
[58] Field of Search .................... 250/201.4, 201.5; 369/44.32

[56] References Cited

U.S. PATENT DOCUMENTS 4,374,324  2/1983  Van Rosmalen et al. ........ 250/201.5
4,661,943  4/1987  Ikeda ........................... 369/44.32

FOREIGN PATENT DOCUMENTS 64-19909  1/1989  Japan .
1-39041   8/1989  Japan .
1-39042   9/1989  Japan .

Primary Examiner—David C. Nelms
Assistant Examiner—K. Shami
Attorney, Agent, or Firm—Lowe, Price, Le Blanc & Becker

[57] ABSTRACT

A semiconductor wafer (WF) is supported on a movable table mechanism (50). A light (L1) is applied to the surface of the semiconductor wafer to inspect the surface state of the semiconductor wafer. In order to maintain the surface of the wafer at the focal point of an objective lens (11) and maintaining the angle of the wafer in perpendicular to the optical axis of the objective lens, a light beam (B1) is generated and directed to the wafer. The reflected light (B2) is divided into first and second beams (BD1, BD2). The first light beam is received by a one-dimensional PSD (position sensing device), while the second light beam is received by a two-dimensional PSD. In response to respective outputs of the one-dimensional PSD and the two-dimensional PSD, the movable table mechanism is driven so as to maintain an in-focus state of the wafer and the objective lens even when the wafer is moved for scanning of respective regions on the wafer.

17 Claims, 25 Drawing Sheets

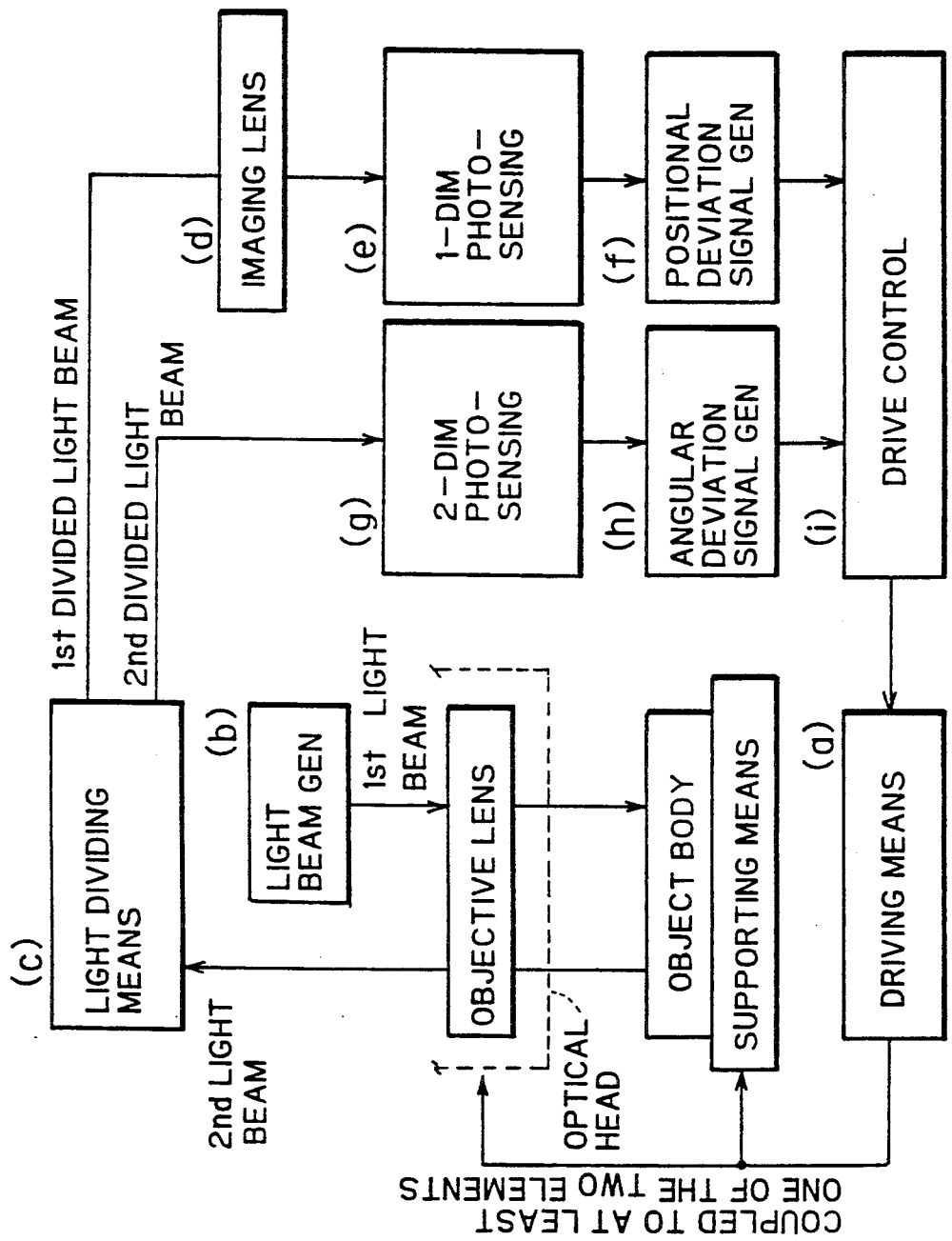

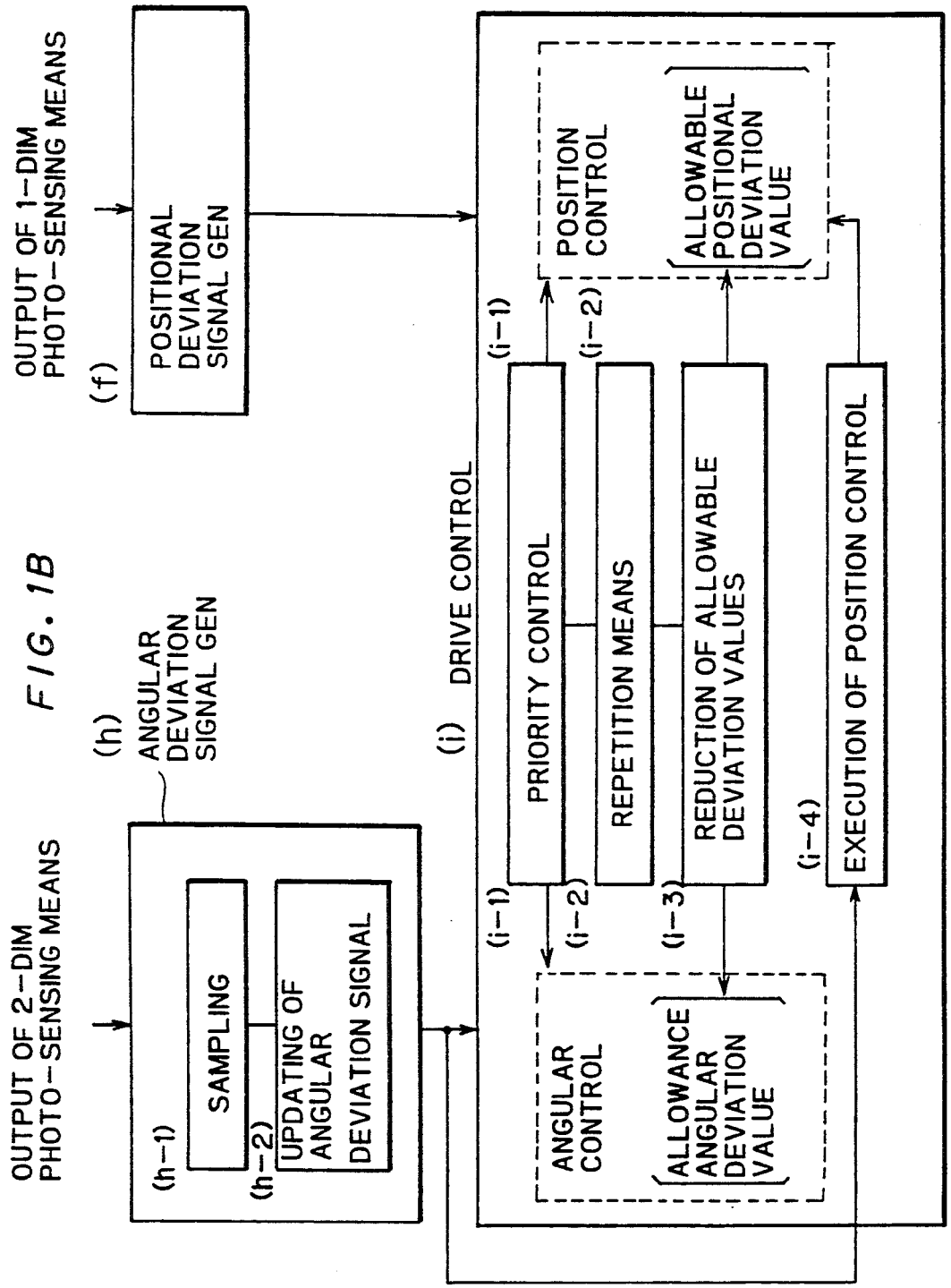

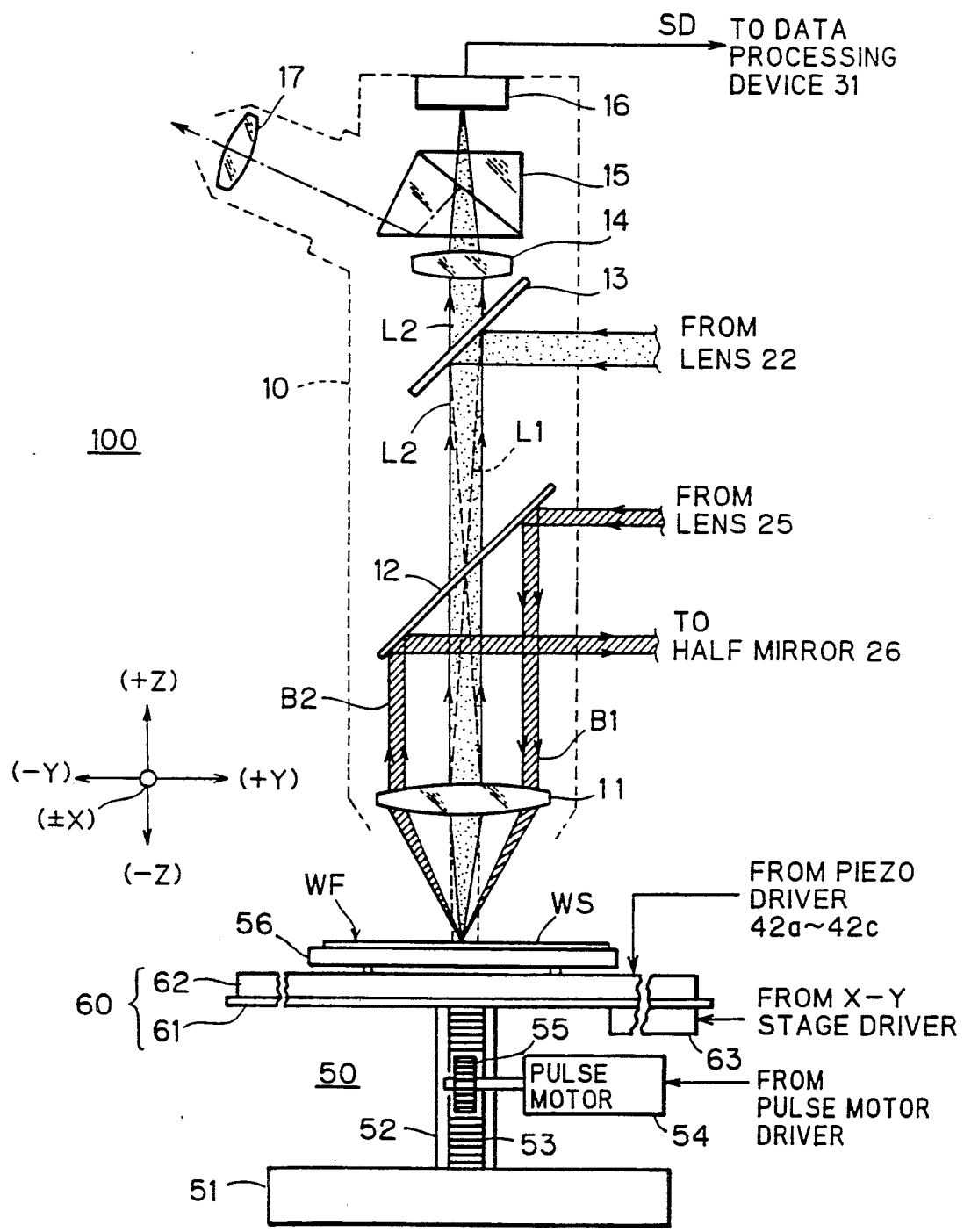

IN FOCUS AND HORIZONTAL

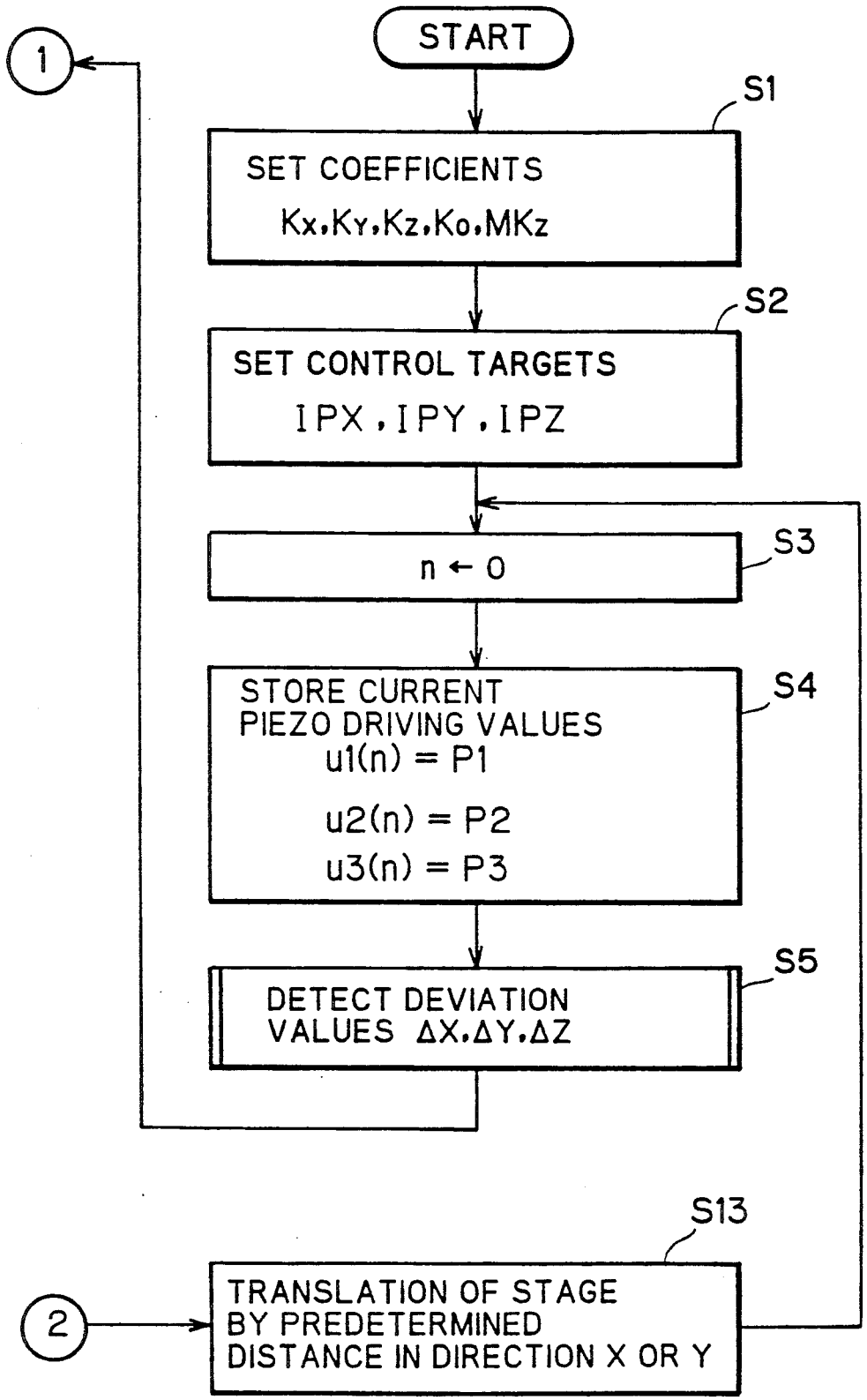
FIG. 9 (FLOW OF OVERALL OPERATION)

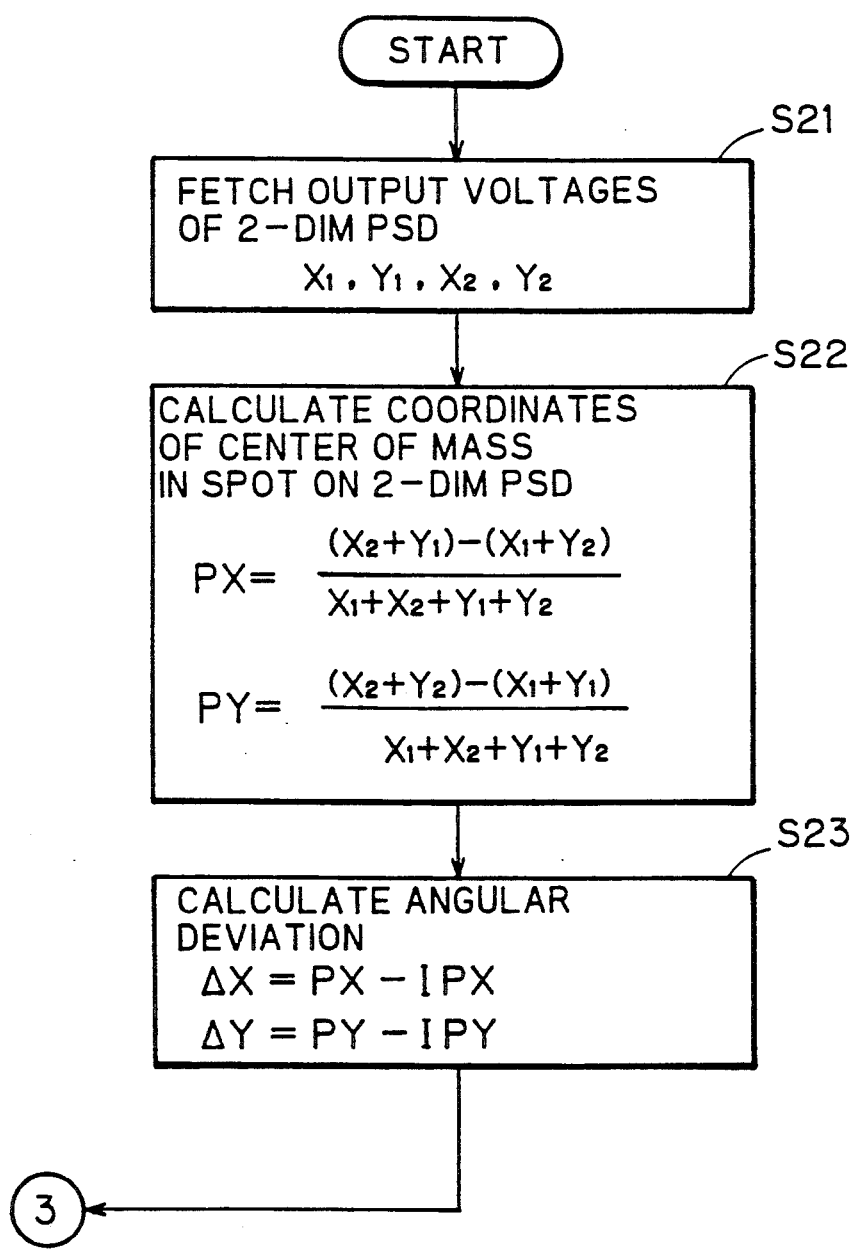

FIG. 11 (POSITIONAL CONTROL / FOCUS CONTROL)
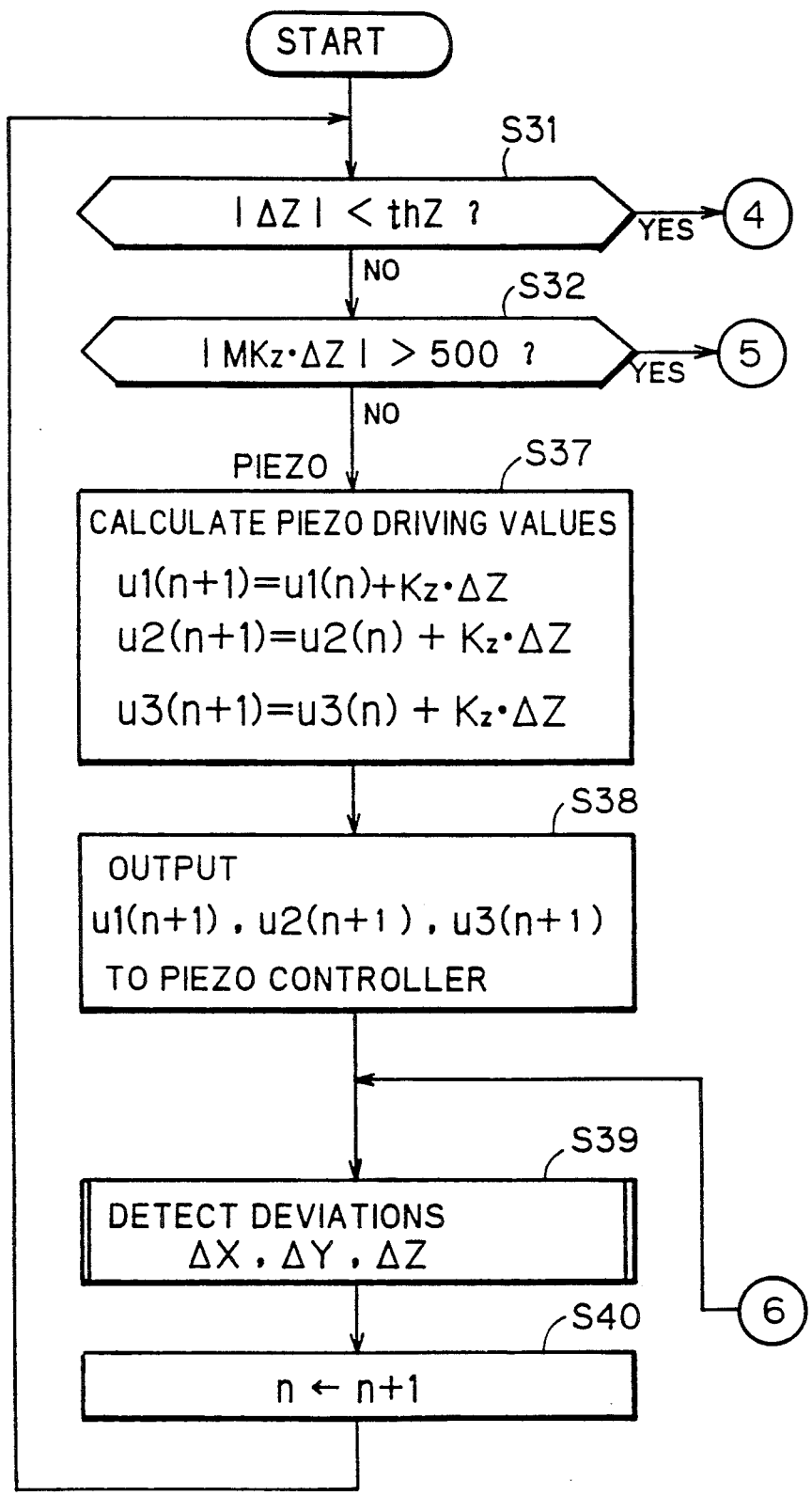

ANGULAR CONTROL
(INCLINATION CONTROL)

METHOD OF FOCUSING OPTICAL HEAD ON OBJECT BODY AND AUTOMATIC FOCUSING DEVICE FOR OPTICAL INSPECTION SYSTEM INCLUDING TILT DETECTION

BACKGROUND OF THE INVENTION

1. Field of the Invention

The present invention relates to a method of focusing an optical head on an object body and an automatic focusing device for an optical inspection system, and more particularly, to a method and a device employable in an optical inspection system of semiconductor wafers and the like.

2. Description of Prior Arts

As well known in the field of semiconductor electronics, semiconductor devices having semiconductor integrated circuits therein are obtained through fabrication of impurity diffused regions, insulating films, wiring patterns and the like in a major surface of a semiconductor wafer. These electronic structure thus fabricated are then inspected with an inspection system in order to determine whether they are accurately formed on the wafer or not. Various non-contact inspection systems have been developed and employed for the inspection.

Within conventional non-contact inspection systems, optical inspection systems are useful ones. In an optical inspection system, an optical inspection of a wafer surface, such as measurement of a film thickness, a measurement of a line width and a check of a surface flaw, is performed with an architecture similar to that of a microscope, where focusing on a wafer surface is required. A device for automatic focusing is disclosed in Japanese Utility Model Laid Open Gazette No. 64-19909 (1989), for example.

In such an optical inspection system, required are not only a position control to adjust an inspected region on a wafer surface to a focal position of an objective lens but also an angular control or attitude control to hold the region-to-be-inspected on the wafer surface always perpendicular to the optical axis of the objective lens. Herein, the region-to-be-inspected is a minute spot of usually about several $\mu$m to 50 $\mu$m in diameter. In a conventional focusing device, however, a system for the angular control is provided separate from a system for a position control, and thus, the number of parts in the device is considerably large. As a result, a process of assembling and regulating the device becomes complicated, and the size of the device should be large. Moreover, the positional deviation between the position control system and the angular control system may cause reduction of accuracy in control.

Furthermore, the two kinds of control system are independently operated, and hence, there arises the problem that a control for quickly converging the position and angle in the optical system to focal ones through systematical combination of the positional control and the angular control cannot be attained.

SUMMARY OF THE INVENTION

The present invention is directed to a method of focusing an optical head on an object body. The optical head comprises an objective lens having a first focal point on an optical axis thereof.

According to the present invention, the method comprises the steps of: (a) emitting a light beam substantially being a parallel ray; (b) directing the light beam to the object body through the objective lens, the light beam reflecting on a surface of the object body, thereby to obtain a reflected light beam of the light beam; and (c) dividing the reflected light beam into first and second divided light beams after the reflected light beam passes through the objective lens.

The first and second divided light beams are employed for focusing the optical head on the object body through the steps of: (d) forming a light spot of the first divided light beam with an imaging lens having a second focal point; (e) detecting a one-dimensional position of the light spot on a first plane which includes the second focal point, thereby to obtain a first position value indicative of the one-dimensional position of the light spot; (f) obtaining a positional deviation value representing a positional deviation of the surface of the object body from the first focal point of the objective lens on the basis of the first position value; (g) detecting a two-dimensional position of the second divided light beam on a second plane associated with the optical axis of the objective lens, thereby to obtain a second position value indicative of the two-dimensional position of the second divided light beam; (h) obtaining an angular deviation value representing an angular deviation of the surface of the object body from a reference plane orthogonal to the optical axis of the objective lens on the basis of the second position value; (i) obtaining movement amounts for reducing both the position deviation and the angular deviation as a function of the positional deviation value and the angular deviation value; and (j) moving at least one of the optical head and the object body on the basis of the movement amounts.

The method may further comprises the step of: (k) repeating the steps (a) through (j) until the position deviation value and the angular deviation value become smaller than predetermined allowable deviation values, respectively.

Preferably, the detection of the two-dimensional position of the second divided light beam in the step (g) is accomplished by detecting a gravity position of the second divided light beam on the second plane.

In an aspect of the present invention, a positional control which is a control to vary the relative positional relation is conducted prior to an angular control which is a control to vary the relative angular relation.

The present invention is also directed to an automatic focusing device employed in an optical inspection system in which an object body supported with supporting means is inspected through an objective lens built in an optical head.

As schematically shown in FIG. 1A, the device according to the predent invention comprises: (a) driving means coupled to at least one of the supporting means and the optical head, for varying relative positional and angular relations between the object body and the objective lens; (b) light beam generating means for generating a first light beam substantially being a parallel ray and for directing the first beam to the objective lens, wherein the first light beam incident on the object body through the objective lens is reflected at the object body to become a second light beam; (c) light dividing means for dividing the second light beam into first and second divided light beams after the second light beam returns through the objective lens; (d) an imaging lens positioned in an optical path of the first divided light beam; (e) one-dimensional photo-sensing means having a first light receiving surface positioned in a focal point of the imaging lens, for detecting a one-dimensional position of a light spot of the first divided light beam on the first light receiving surface; (f) positional deviation signal generating means for generating a positional deviation signal representing a positional deviation of an inspected plane in the object body from a focal point of the objective lens based upon an output signal of the one-dimensional photo-sensing means; (g) two-dimensional photo-sensing means having a second light receiving surface for receiving the second divided light beam, for detecting a two-dimensional position of the second divided light beam on the second light receiving surface; (h) angular deviation signal generating means for generating an angular deviation signal corresponding to an angular deviation of the inspected plane from a reference plane orthogonal to an optical axis of the objective lens based upon an output signal of the two-dimensional photo-sensing means; and (i) drive control means for generating a drive command signal as a function of the positional deviation signal and the angular deviation signal and for delivering the drive command signal to the driving means to enable the driving means so that the positional deviation and the angular deviation reach values smaller than predetermined allowable deviation values.

Preferably, as shown in FIG. 1B, the drive control means comprises: (i-1) priority control means for conducting a positional control prior to an angular control; and (i-2) repetition means for enabling the priority control means repeatedly, to thereby repeat the positional control and the angular control.

The positional control is a control for varying the relative positional relation, and the angular control is a control for varying the relative angular relation.

The drive control means may further comprise: (i-3) means for reducing the allowable positional deviation value and the allowable angular deviation value by degrees in repetition of the positional control and the angular control.

In an aspect of the present invention, the angular deviation signal generating means comprises: (h-1) means for repeatedly sampling an output signal of the two-dimensional photo-sensing means during the angular control to detect the angular deviation at each sampling; and (h-2) means for sequentially updating a value of the angular deviation signal as a function of the angular deviation detected by the means (h-1). Correspondingly, the drive means may further comprise (i-4) means for executing the position control in accordance with the value of the positional deviation signal whenever the means (h-2) updates the value of the angular deviation signal.

In the device according to the present invention, the second light beam reflected by the object body is divided, and the first and second divided light beams obtained by the division are used to detect the positional deviation and the angular deviation, respectively.

Thus, there is no need of providing a light source for a positional control and that for an angular control separately. In this way, not only the number of the required parts is reduced, but also it is prevented that a relative arrangement between lights emitted from a plurality of light sources for control affects an accuracy in control.

The positional control and the angular control are performed based upon the light beams reflected by the same areas on the surface of the objected body. Therefore, the area in which the positional deviation is detected and the area in which the angular deviation is detected never deviate from each other, and from this point of view, an accuracy in control and an accuracy of focusing are improved.

Since the positional control is conducted prior to an angular control, deviation becomes a considerably small value at the time when the angular control is performed. As mentioned below, a detection of the angular deviation affects the positional deviation. Hence, an accuracy in the angular control and consequently an accuracy in the combination of the positional control and the angular control can be further enhanced by performing the positional control prior to the angular control.

In an aspect of the present invention, the positional control and the angular control are alternately performed, and in the repetition of the controls, an allowable error becomes smaller in a stepwise manner. Thus, although the positional deviation and the angular deviation affects each other, the amount of the deviation to be reduced in each repetition step is small. Consequently, the control operation does not diverge, and a convergence to a desirable value of control is made quickly.

When the positional control is carried out in each repetition step in the angular control, the convergence of the control operation is enssured.

The present invention also provide a movable table mechanism employable in the above-indicated devise.

Accordingly, an object of the present invention is to provide a method of focusing an optical head on an object body in which positional and angular controls are accurately attained without many elements or members.

Another object is to provide a compact automatic focusing device having a function of both the positional and angular controls, easy in building and regulating and capable of implementing a control of high accuracy.

It is another object of the present invention to quicken a convergence to a required value by making an effective use of respective properties of positional and angular controls.

Further another object of the present invention is to provide a movable table mechanism employable in the method and device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are function block diagrams showing a device according to the present invention;

FIGS. 2A through 2C as combined in accordance with FIG. 2 are diagrams showing an overall structure of an optical inspection system having an automatic focusing device according to a preferred embodiment of the present invention;

DESCRIPTION OF PREFERRED EMBODIMENTS

<A. Optical Structure>

Figure 2:
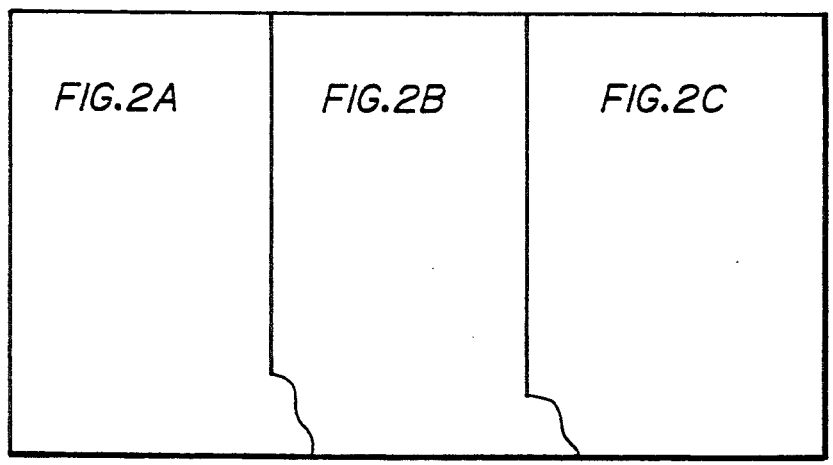
FIG. 2 is a diagram showing an arrangement of FIGS. 2A–2C.
Figure 2B:
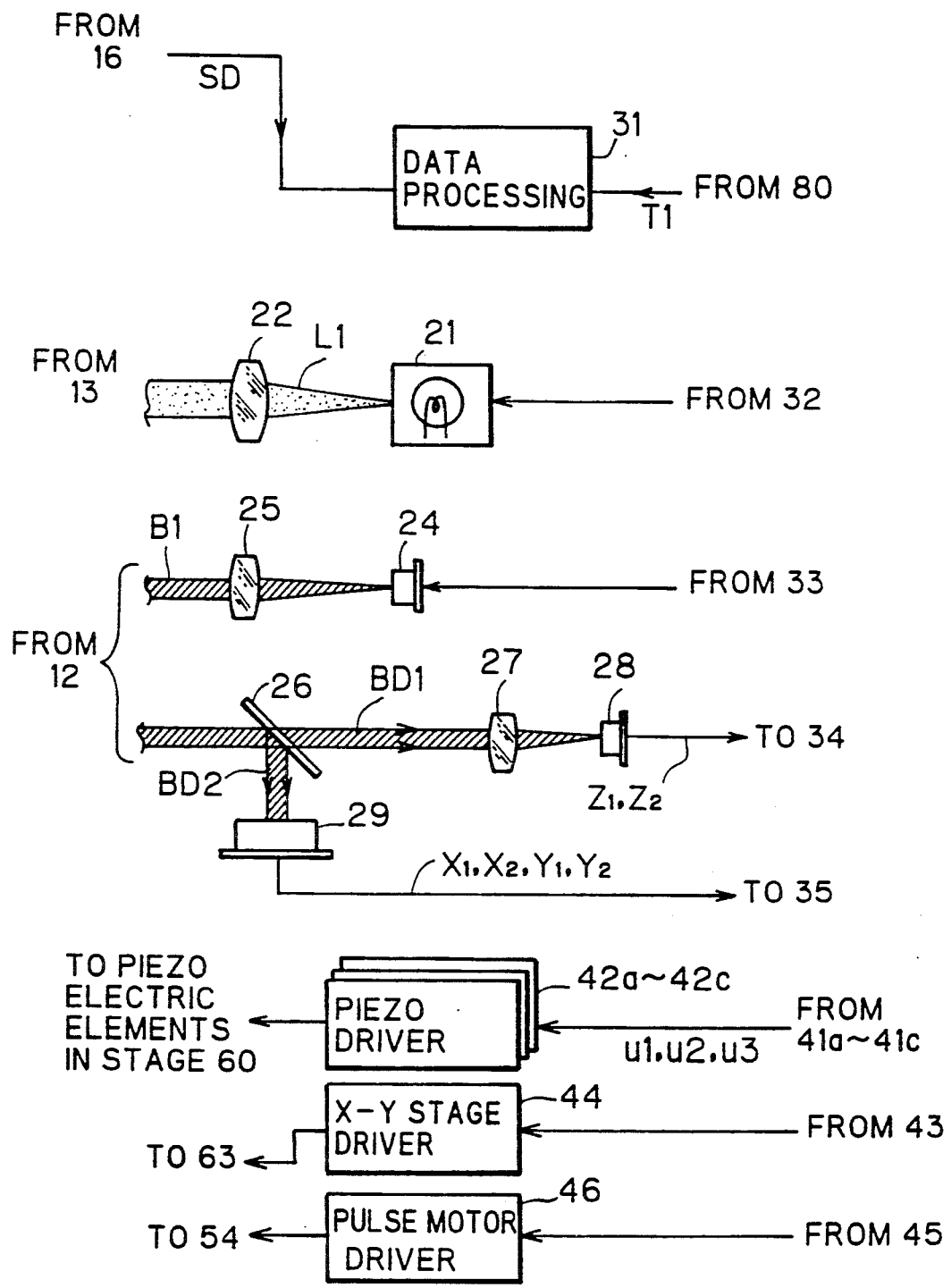
Figure 2C:
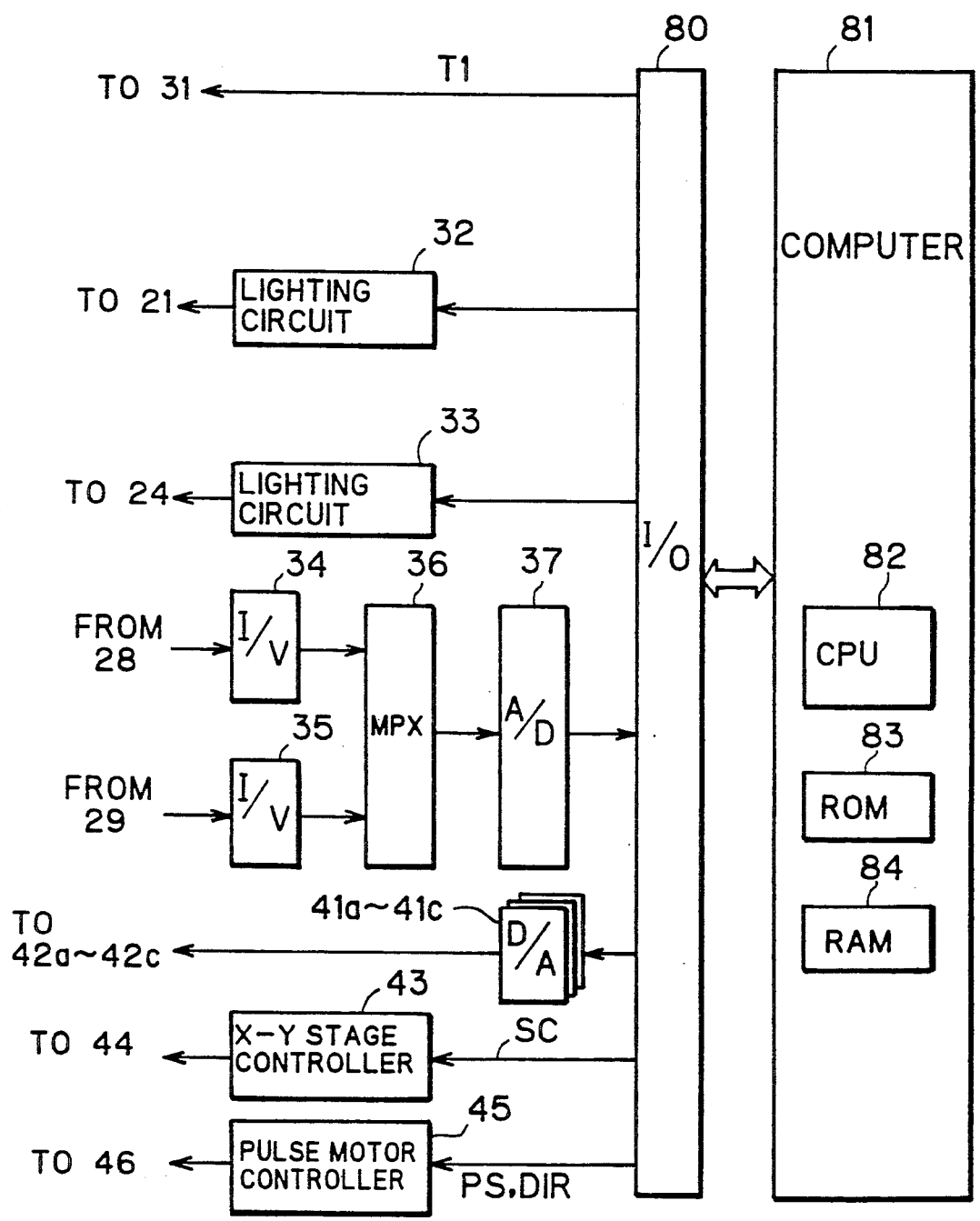

FIGS. 2A through 2C as combined in accordance with FIG. 2 show the overall structure of a semiconductor wafer inspection system 100 comprising an automatic focusing device according to a preferred embodiment of the present invention. The system 100 is generally composed of an optical part, a mechanical part, and an electrical part, which are described in the following sections.

<(A-1) Optical System for Wafer Inspection>

The inspection system 100 is a system employing an optical microscope which comprises a lens-barrel 10 serving as an optical head. The lens-barrel 10 holds an objective lens 11 in its bottom portion. The objective lens 11 may be one of lens groups housed in a turret lens holder.

Figure 14:
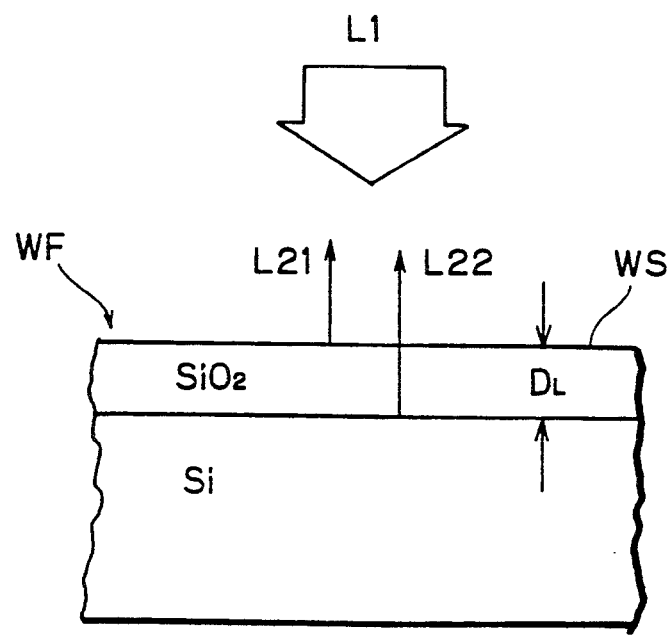
FIG. 14 is an enlarged partial sectional view showing a semiconductor wafer as an object-to-be-inspected in the preferred embodiment.

A halogen lamp 21 is provided on a side of the lens-barrel 10. Light L1 emitted from the halogen lamp 21 passes through an illuminating lens 22, a half mirror 13 and a half mirror or a dichroic mirror 12 to fall on an objective lens 11. Under the objective lens 11, a semiconductor wafer WF is supported by a supporting mechanism mentioned later. As shown as an enlarged partial sectional view in FIG. 14, the wafer WF is composed of a silicon substrate with an oxidation silicon film formed thereon. The light L1 focused with the objective lens 11 onto a region-to-be-inspected (referred to as "inspected plane" hereinafter) on a wafer surface WS is partially reflected at the wafer surface WS (i.e., the surface of the silicon oxidation film) to become a reflected light L21, while it is also partially reflected at the interface between the silicon substrate and the oxidation silicon film to become a reflected light L22. The incident light L1 partially undergoes a multiple reflection in the wafer WF and is partially absorbed therein, but the multiple reflection is not essential in the present invention and the explanation about it is omitted.

Between the reflected lights L21 and L22, there is a difference in optical length which equals to the double of the product of a thickness $D_L$ of the oxidation silicon film and its refractive index. Thus, the reflected lights L21 and L22 have a phase difference therebetween and an interference light of the reflected lights L21 and L22 proceeds upwards in FIG. 2A through the objective lens 11. The interference light L2 travels through the half mirrors 12 and 13, the imaging lens 14 and a prism 15 to fall on a spectroscope 16. The spectroscope 16 detects the intensity of the interference light L2 to generate a photoelectric signal SD expressing the intensity. The signal SD is delivered to a data processing device 31. The data processing device 31 evaluates the thickness $D_L$ of the oxidation silicon film based upon a level of the photoelectric signal SD to thereby carry out an inspection on the surface state of the wafer WF.

A timing of taking the signal SD in the data processing device 31 is determined according to a timing signal T1 received from a computer 81 mentioned later. An image on the surface of the wafer WF is observable by eyes through an ocular lens 17.

<(A-2) Control Optical System>

On the other hand, a laser diode 24 is provided in a fixed position related to the lens-barrel 10. The laser diode 24 emits a monochromatic light having a wavelength of 780 nm. The light passes through a collimater lens 25 and is thereby converted into a light beam B1 substantially being parallel ray. The light beam B1 is reflected by the half mirror 12 and focused onto the surface WS of the wafer WF by the objective lens 11. An incident position of the light beam B1 on the objective lens 11 is deviated in a (+Y)-direction from the optical axis of the objective lens 11. Hence, the light beam B1 reflected by the wafer WF enters a part of the objective lens 11 deviated in a (−Y)-direction from the optical axis of the objective lens 11 and proceeds upwards as a light beam B2.

Figure 3A:
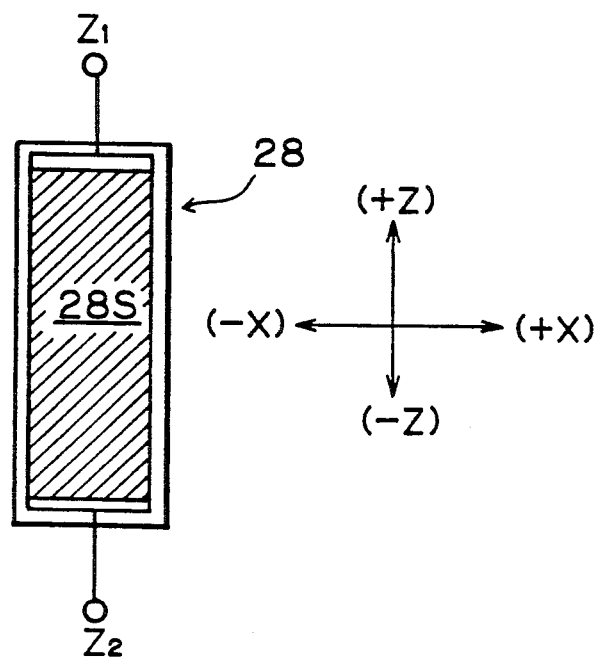
FIG. 3A is a diagram showing a light receiving surface of a one-dimensional PSD.

The light beam B2 is reflected by the half mirror 12 and then falls on a half mirror 26. The light beam B2 is divided by the half mirror 26 into first and second divided light beams BD1 and BD2. Out of the two light beams, the first divided light beam BD1 is focused by an imaging lens 27 and makes a light spot on a light receiving surface of a one-dimensional position sensing device (PSD) 28. As shown in FIG. 3A, the light receiving surface 28S of the one-dimensional PSD 28 extends in ($\pm Z$)-directions, and current signals $Z_1$ and $Z_2$ are outputted from two electrodes of the one-dimensional PSD 28 as position detecting signals indicative of the position of the light spot on the light receiving surface 28S in the ($\pm Z$)-directions.

Figure 3B:
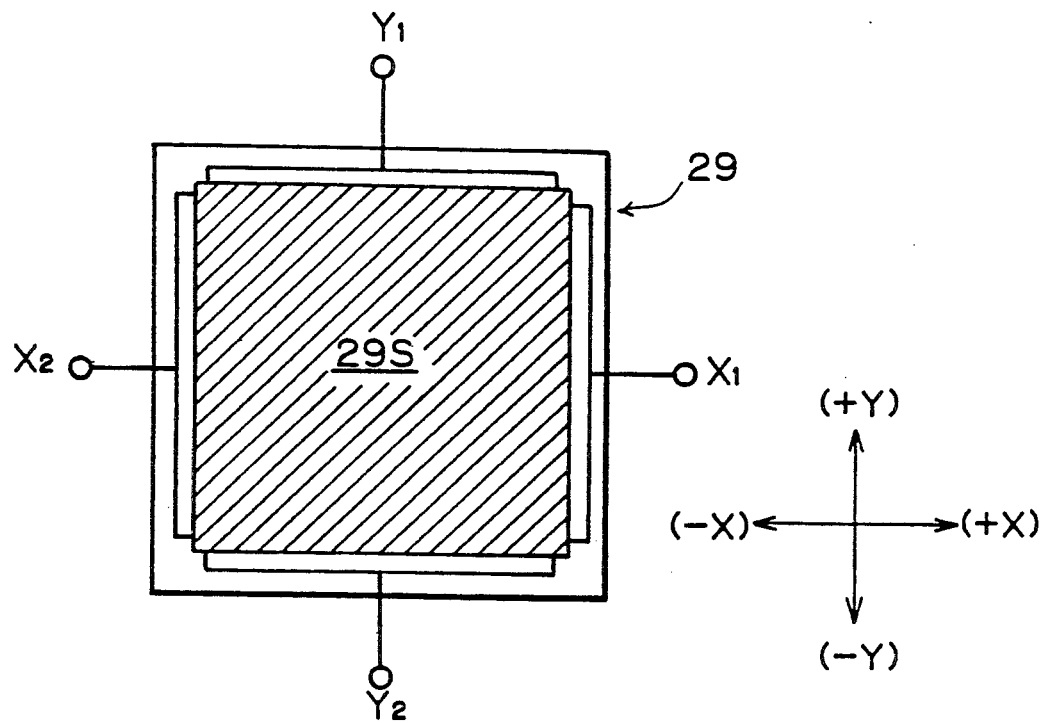
FIG. 3B is a diagram showing a light receiving surface of a two-dimensional PSD.

On the other hand, the second divided light beam BD2 falls on a light receiving surface of a two-dimensional PSD 29 as a two-dimensional position sensing device. As shown in FIG. 3B, the light receiving surface 29S of the two-dimensional PSD 29 is in parallel with an X—Y plane, and outputs current signals $X_1$, $X_2$, $Y_1$ and $Y_2$ from four electrodes thereof. These current signals $X_1$, $X_2$, $Y_1$ and $Y_2$ are generated on the basis of the gravity of the light beam on the light receiving surface 29S, and serve as position detecting signals indicative of the two-dimensional position of the second divided light beam BD2 on the X—Y plane.

Figure 4A:
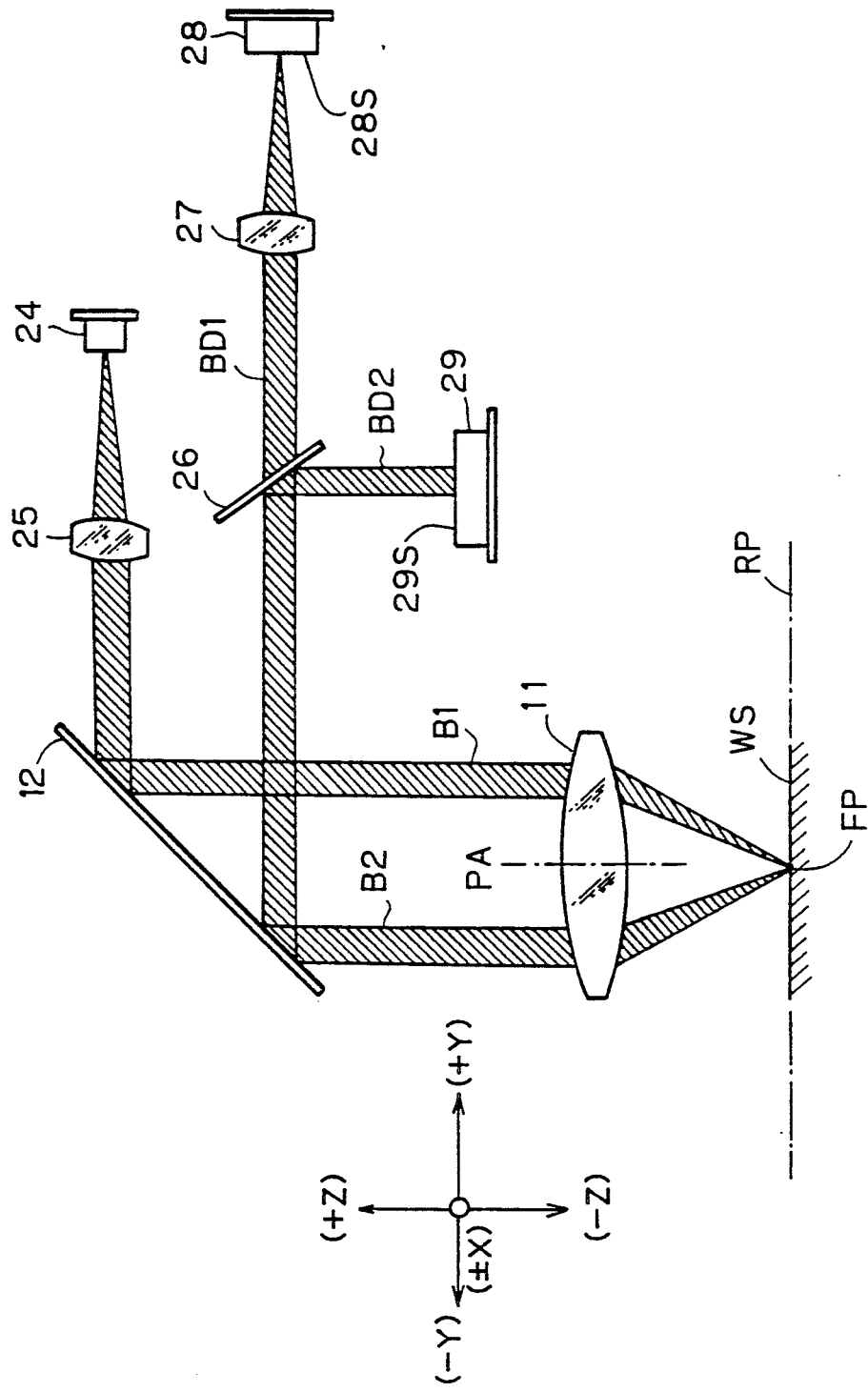
FIGS. 4A through 4D are diagrams for explaining an influence of the position and angular relations between a wafer surface and a reference plane on light-receiving conditions in the one-dimensional and two-dimensional PSDs.

Out of the PSDs 28 and 29, the one-dimensional PSD 28 is for detecting a de-focus value which is positional deviation of the inspected plane from a focal point of the objective lens 11. The two-dimensional PSD 29 is for detecting a angular deviation, namely, an inclination amount of the inspected surface from a reference plane orthogonal to the optical axis of the objective lens 11. The principle and properties of the deviation inspection are as follows:

First, referring to FIG. 4A, a reference plane RP is defined which passes a focal point FP of the objective lens 11 and is orthogonal to an optical axis PA of the objective lens 11, and therefore, the inspected plane is just on the reference plane RP. In other words, in FIG. 4A, the inspected plane is in an in-focal position and horizontal. At this time, above the objective lens 11, the light beam B2 becomes a parallel ray proceeding in the (+Z)-direction. The arrangement of respective optical elements is determined so that, in the state shown in FIG. 4A, the first divided light beam BD1 enters the center of the light receiving surface 28S of the one-dimensional PSD 28 while the second divided light beam BD2 enters the center of the light receiving surface 29S of the two-dimensional PSD 29.

Figure 4B:
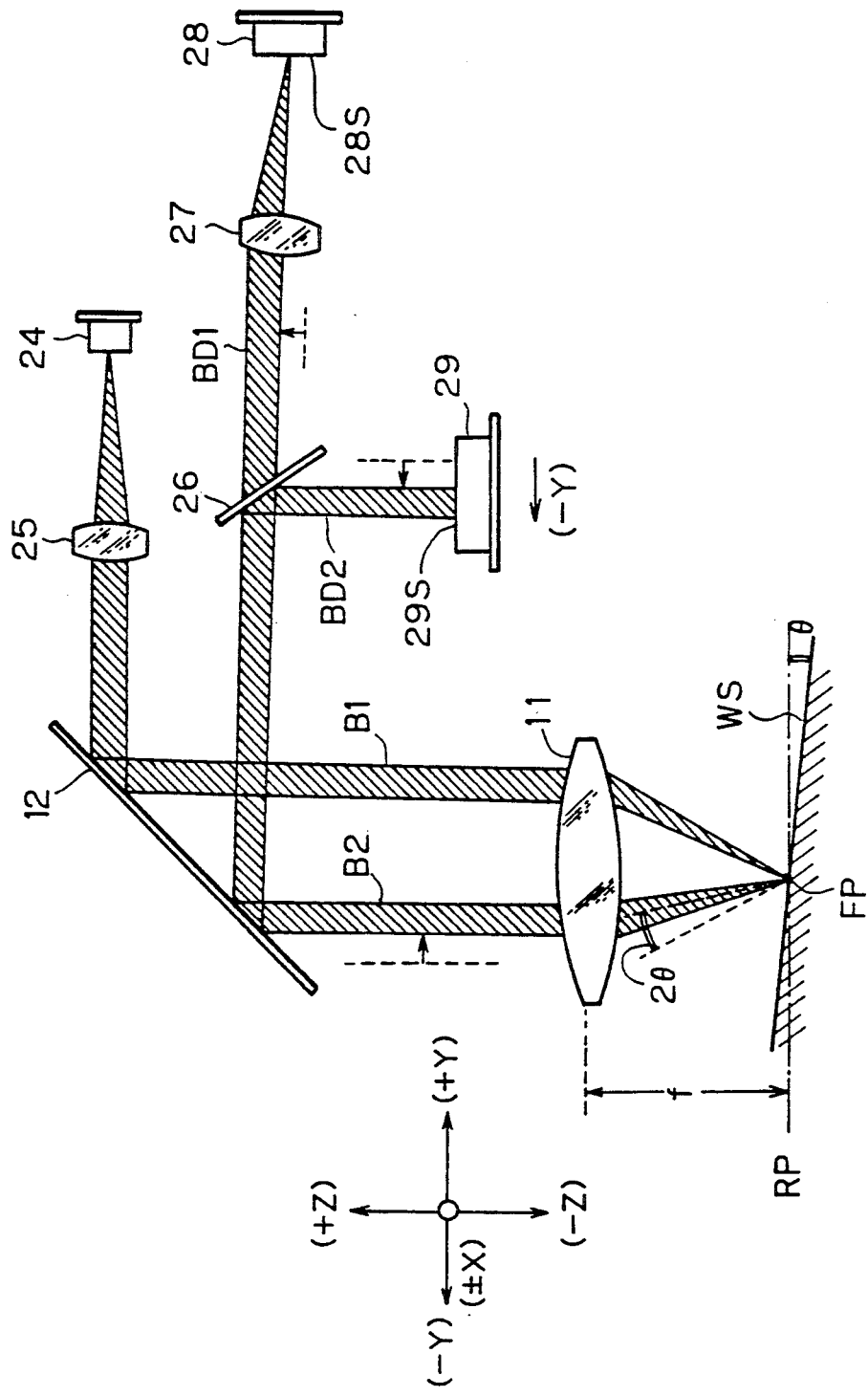

FIG. 4B shows a state in which the inspected plane is inclined from the reference plane RP by an angle $\theta$. However, the inspected plane passes the focal point FP of the objective lens 11, and therefore, the objective lens 11 and the inspected plane are in an in-focus state. At this time, the light beam reflected by the wafer surface WS proceeds in a direction inclined by an angle $2\theta$ from the case shown in FIGS. 2A–2C. As a result, an optical path of the light beam B2 above the objective lens 11 is deviated from the case of FIG. 4A, and the amount of the deviation in the (+Y)-direction at the objective lens 11 is:

$$f\cdot\sin(2\theta) \qquad (1)$$

where f is a focal length of the objective lens 11.

From the fact that the inspected plane is at the focal position, the light beam B2 is a parallel ray and its proceeding direction is the (+Z)-direction.

As a result of the above deviation, in the two-dimensional PSD 29, a light receiving position of the second divided light beam BD2 is deviated in the (−Y)-direction, while, in the one-dimensional PSD 28, a position where a light spot is formed is substantially the same as in the case of FIG. 4A. The reason is that as the first divided light beam BD1 is a parallel ray traveling in the (+Y)-direction, it is converged to the focal point of a focusing lens 27, namely, the center position of the light receiving face 28S of the one-dimensional PSD 28 even if the optical path of the beam translates in the (+Z)-direction. As can be seen from FIG. 4B, when the inspected plane is adjusted to the focal point and inclined, generally, the position where the second divided light beam BD2 is received in the two-dimensional PSD 29 is shifted in the X—Y plane, but the position where a light spot is formed in the one-dimensional PSD 28 is unvaried. When the value of the angle $\theta$ is small, the formula (1) can approximate as $(2f\theta)$. Thus, in this case, the angular deviation $\theta$ is in proportion to a deviation amount of the position at which the second divided light beam BD2 is received in the light receiving surface 29S of the two-dimensional PSD 29. Therefore, in this preferred embodiment, the deviation amount of the light receiving position on the light receiving surface 29S is treated as identical to the angular deviation $\theta$.

Figure 4C:
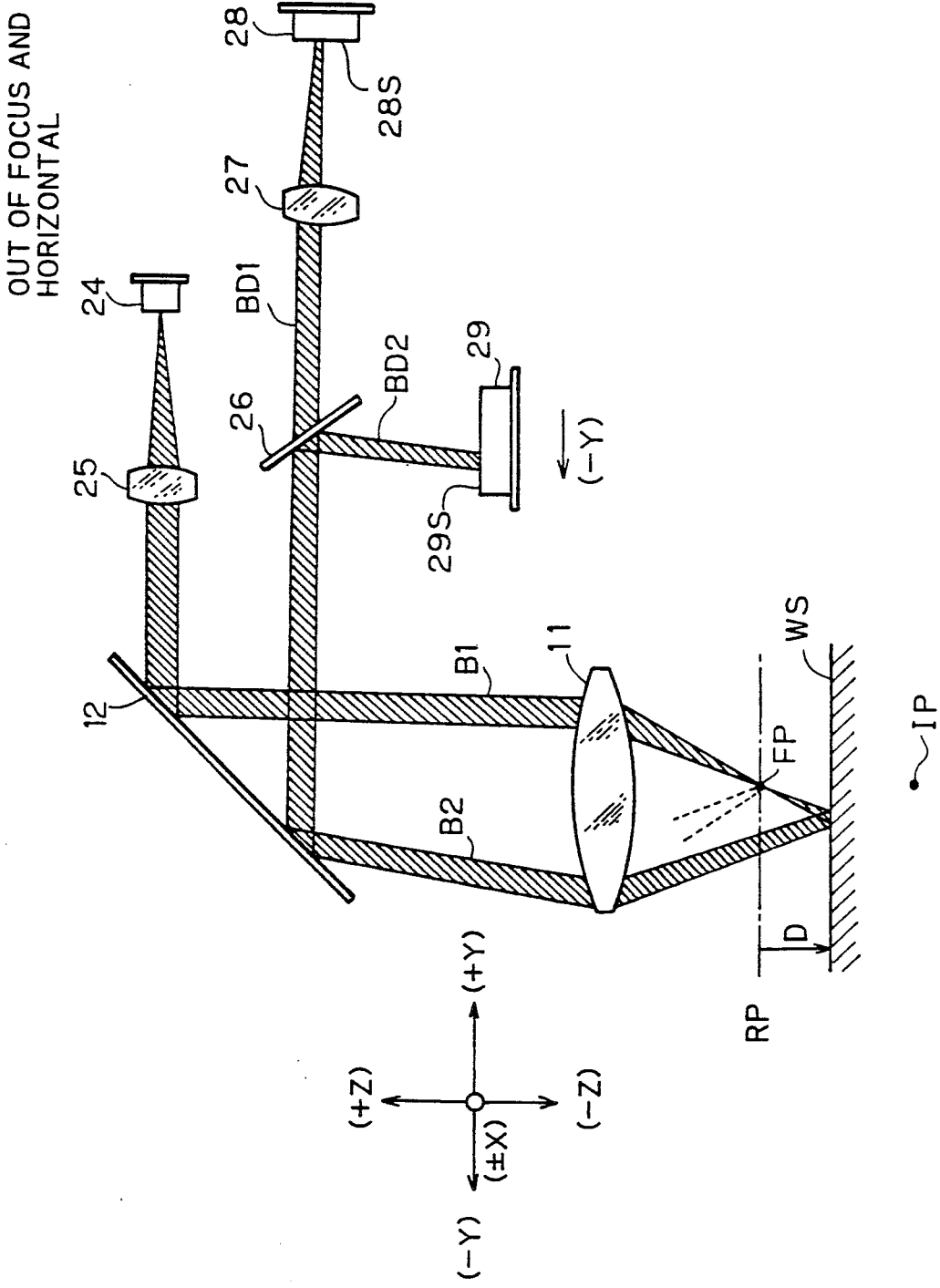

FIG. 4C shows a case where the inspected plane is not inclined and positioned out of the focal point because of the deviation in the (−Z)-direction from the reference plane RP. The reflected light beam B2 at this time is equivalent to a light emitted from a virtual point light source supposed at a point IP symmetrical to the focal point FP of the objective lens 11 with respect to the wafer surface WS. Thus, the light beam B2 after passing through the objective lens 11 does not become a parallel ray, and its optical path is deviated from the (+Z)-direction. As a result, the first divided light beam BD1 also has its optical path deviated from the (+Y)-direction, and the light spot forming position on the light receiving surface 28S of the one-dimensional PSD 28 is shifted. The shift amount is in proportion to a positional deviation D of the inspected plane from the reference plane RP. Thus, in general, a positional deviation of the inspected plane in the (+Z)-direction from the reference plane RP can be detected with the one-dimensional PSD 28.

Under such an out-of-focus condition, as the second divided light beam B2 is also deviated from the optical path in the in-focus condition, the beam receiving position on the two-dimensional PSD 29 is also shifted. A change in output of the two-dimensional PSD 29 is caused not only by the inclination of the inspected plane but by the deviation from the in-focus condition. In other words, when the beam receiving position on the two-dimensional PSD 29 is deviated from the center of the light receiving surface 29S, it cannot be judged simply from the output of the two-dimensional PSD 29 whether the deviation is caused by the inclination of the inspected plane only or is caused by an influence of the out-of-focus condition as well as the inclination of the inspected plane.

Figure 4D:
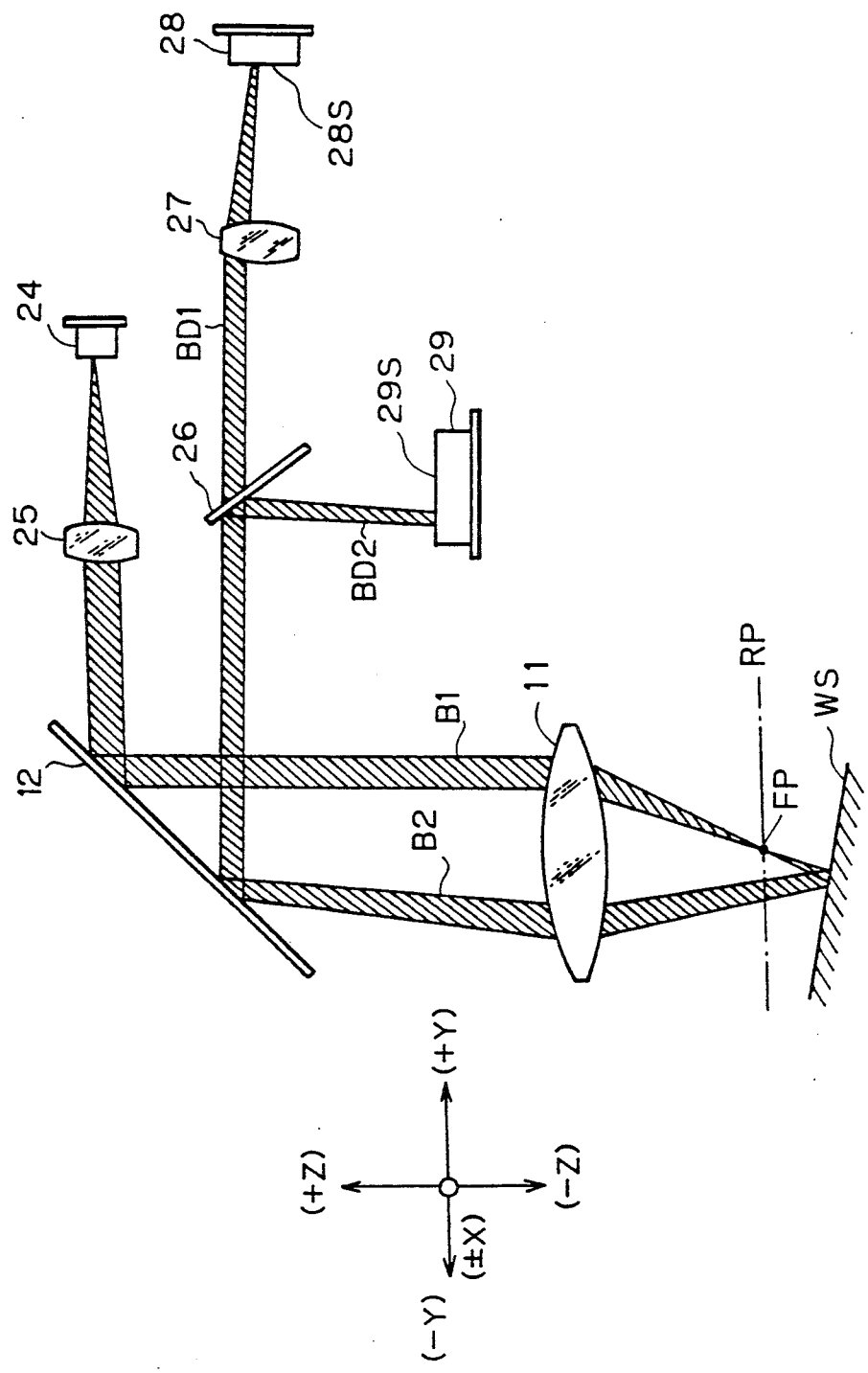

Contrarily, as the light spot forming position on the one-dimensional PSD 28 is shifted only in the out-of-focus condition, the control to return the inspected plane to the focused position can be carried out with reference only to an output of the one-dimensional PSD 28. In general, in order to effectively utilize the above property, it is preferred that the focusing control to return the inspected plane to the focal point which is conducted with reference to the output of the one-dimensional PSD 28 is performed prior to the angle control to return the inspected plane to a horizontal state, i.e., a state orthogonal to the lens axis. This principle is applicable to all cases including the case in which the inspected plane is out of focus and inclined (FIG. 4D). When the inspected plane is returned to or close to the focal point, the angular control or inclination control to make the inspected plane horizontal with reference to the output of the two-dimensional PSD 29 can be effectively carried out. A feedback control system mentioned later is designed based upon such an aspect.

<B. Mechanical Construction>

Referring back to FIGS. 2A–2C, the inspection system 100 comprises a table mechanism 50 for supporting and moving the wafer WF. The table mechanism 50 has a supporting pillar 52 which is installed on a base member 51 and is movable vertically. A rack 53 is attached to the supporting pillar 52. A pulse motor 54 rotates to cause a pinion 55 to move the rack 53, and this forces the supporting pillar 52 to vertically move in the (±Z)-direction. The rack and pinion mechanism serves as a mechanism for a coarse regulation in a focus control of the wafer WF.

An X-Y stage 60 is provided on the supporting pillar 52. The X-Y stage 60 includes a table 61 fixed to the supporting pillar 52 and a table 62 movable in X-Y directions on the fixed table 61. The table 62 is driven by a motor 63 for a movement in the X-Y directions. A wafer stage 56 is supported by three pinions (two of them are shown in FIG. 2A) extending from the table 62 in the (+Z)-direction. The wafer WF is placed and held on the stage 56.

Figure 5A:
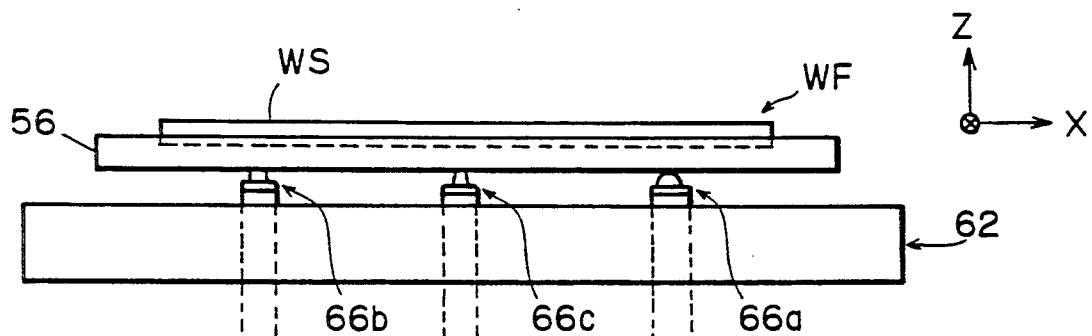
FIGS. 5A and 5B are diagrams showing an arrangement of piezo actuators.
Figure 5B:
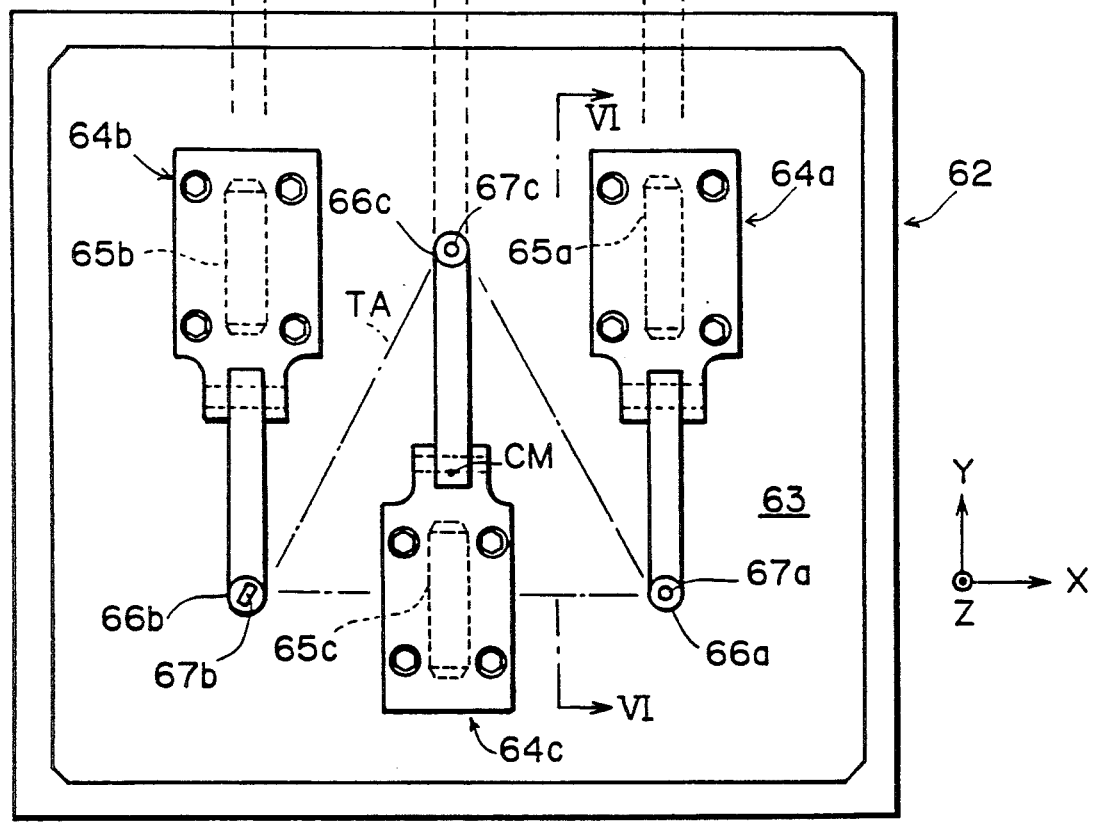
Figure 6:
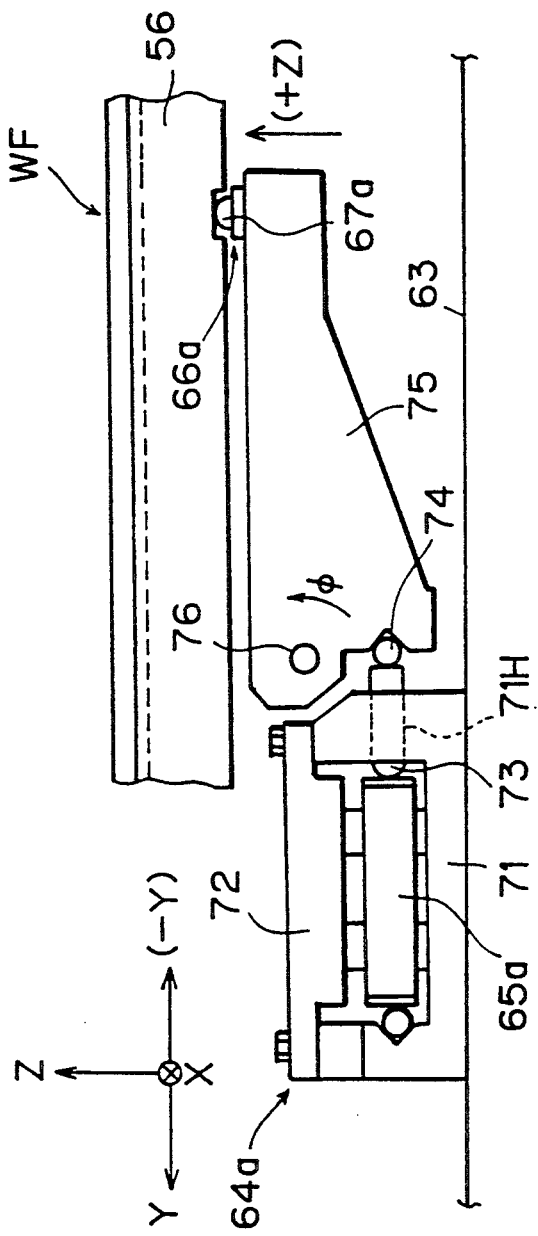
FIG. 6 is a side view seen from a position along the line VI—VI in FIG. 5.

FIG. 5A is a side view showing the movable table 62 and its upper structure seen from the (+Y)-direction of FIG. 2A, while FIG. 5B is a plan view showing the table 62. FIG. 6 is an enlarged side view along the line VI—VI of FIG. 5B. As shown in FIG. 5B, three piezo actuators 64a through 64c are attached onto an inner floor 63 of the table 62. As shown in FIG. 6, the piezo actuator 64a has a piezo element 65a positioned between metal blocks 71 and 72. The piezo element 65a extends in a horizontal direction, and its end comes in contact with a horizontal pin 73. The horizontal pin 73 extends through a horizontal hole 71H formed in the metal block 71, and its the other end is in contact with a metal ball 74. The metal ball 74 is rotatably attached to the bottom side of an arm 75. The arm 75 is pivotally held by a pin 76, and to its other upper end, a pin 66a are attached upright.

Thus, the piezo actuator 64a is a lever with a supporting point of the pin 76. When the piezo element 65a expands, the horizontal pin 73 moves in the (−Y)-direction and the arm 75 rotates in a φ-direction, so that the pin 66a push the bottom surface of the wafer stage 56 up in the (+Z)-direction. Contrarily, when the piezo element 65a shrinks, the wafer stage 56 falls because of its weight. If the stage 56 should fall quickly, the arm 75 may be pushed by an elastic member, such as a flat spring and the like, in the (−Z)-direction. With such a lever, even if an expansion and shrink stroke of the piezo element 65a is relatively short, a rising and falling stroke of the wafer stage 56 can be made long. A stroke magnification rate in this embodiment is about ten, and the rate of a distance between the metal ball 74 and the pin 76 to a distance between the pin 76 and the pin 66a is 1:10.

The remaining piezo actuators 64b and 64c in FIG. 5B also have a configuration similar to FIG. 6. Shrinking the piezo element 66b, 66c makes the pin 66b, 66c rise and fall. The piezo elements 66a-66c are arranged into a triangle. The actuators 64a through 64c have their respective pins 66a through 66c, which are formed into unique shapes different from one another and are inserted into concave portions 68a-68c formed on the bottom surface of the stage 56. In the first actuator 64a, an end portion 67a of the pin 66a (FIG. 7A) is spherical in shape, and the concave portion 68a of the wafer stage 56 facing to the end portion 67a is cylindrical in shape with a flat circular bottom surface of a diameter larger than the end portion 67a of the pin 66a. Thus, vertically moving the pin 68a causes the wafer stage 56 to vertically move, and additionally, as conceptionally shown by star-like arrows in FIG. 7A, the end portion 67a of the pin 66a is two-dimensionally movable in the concave portion 68a.

Figure 7A:
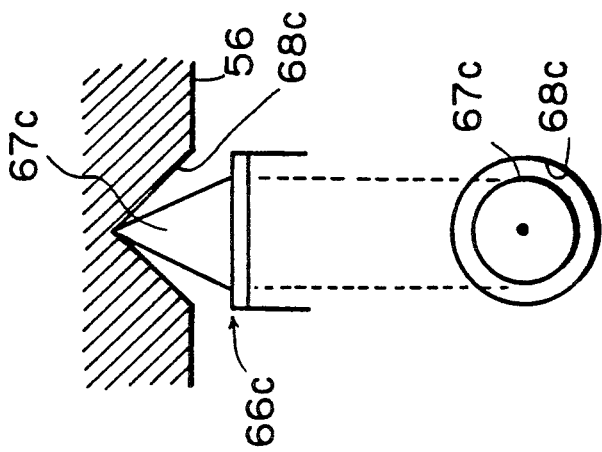
FIGS. 7A through 7C are diagrams showing a pin-structure in an end portion of a piezo actuator.
Figure 7B:
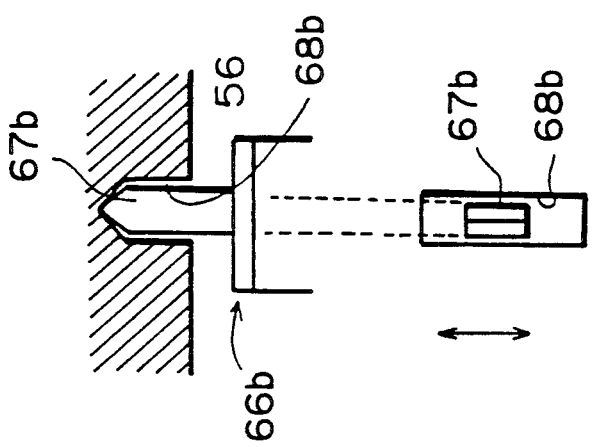

An end portion 67b of the pin 66b in the second actuator 64b is, as shown in FIG. 7B, gable-roof-like and prismatic in shape. The concave portion 68b receiving the end portion 67b at the bottom surface of the wafer stage 56 is formed like a groove having a tapered bottom in which the opening angle of the taper bottom is larger than the vertex angle of the gable roof in the end portion 67b of the pin 66b. The groove is longer than the gable roof of the pin 66b. Thus, when the pin 66b is vertically moved, as shown by a bi-directional arrow in FIG. 7B, the end portion 67b is vertically moved and is slidable along the groove in the longitudinal direction of the concave portion 68b.

Figure 7C:
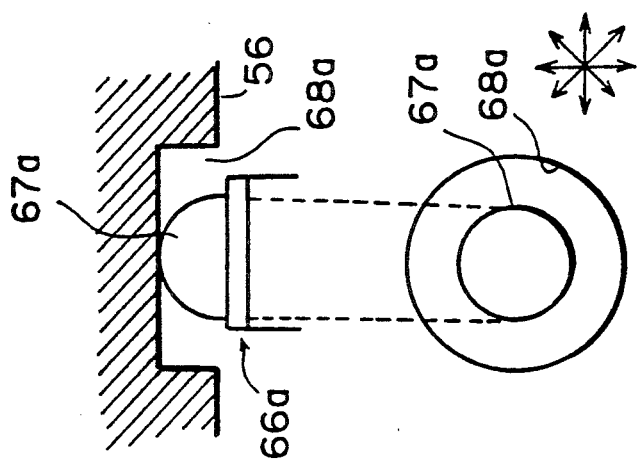

Further, in the third actuator 64c, an end portion 67c of the pin 66c is conical in shape (FIG. 7C). The concave portion 68c of the wafer stage 56 facing to the end portion 67c is conical in shape and has an apex angle larger than the apex angle of the end portion 67c of the pin 66c. Thus, when the pin 66c is vertically moved, the wafer stage 56 can be vertically moved kept horizontal or inclined but cannot be moved in the horizontal direction in the concave portion 68c.

As shown in FIG. 5B, the piezo actuator 64a through 64c are disposed so that the three pins 66a through 66c are positioned at respective vertices of an equilateral triangle TA in an X-Y plane. Although not shown in FIG. 5A, the concave portions 68a-68c are also arranged into a triangle in congruence with the triangle TA. The end portion 67b of the pin 66b and the concave portion 68b in FIG. 7B have their respective longitudinal directions in the horizontal section which are in parallel with a line connecting the pins 66b and 66c (see FIG. 5B), the line being one of the sides of the triangle TA. By driving a part of or all the piezo elements 65a through 65c, the positions or levels of the wafer stage 56 and the wafer WF in the Z-direction (level) and an inclination thereof from the X-Y plane to be changed arbitrarily.

On the bottom surface of the stage 56, the pins 66a, 66b can translationally move or slide in the horizontal directions as already explained with reference to FIGS. 7A and 7B. Hence, even if the stage 56 is inclined, no stress in the horizontal directions arises in the pins 66a through 66c. In other words, in the mutual relations between the pins 66b and 66c, the end portion 67b of the pin 66b one-dimensionally moves in the groove 68b in FIG. 7B to absorb an influence of the inclination of the stage 56. On the other hand, the pin 66a should absorb an influence of the inclination of the stage 56 in the mutual relations with two pins 66b and 66c, respectively, and this is attained through the above-indicated construction that the pin 66a is two-dimensionally movable in a horizontal plane as explained in FIG. 7A.

In such a three-point supporting as in this embodiment, it is preferred that the first one of the three supporting members, which are the pins 66a-66c in this embodiment, does not move in the horizontal directions while the second one can move only one-dimensionally and the third one can move two-dimensionally. If the degree of freedom is smaller than these conditions, a stress in the horizontal direction is applied to a part of or all the pin 66a through 66c when the stage 56 is inclined. On the contrary, if the freedom is excessive, a redundant freedom arises between the stage 56 and the pins 66a-66c, and a spatial position of the stage 56 is not uniquely determined when the levels of the pins 66a through 66c are determined.

Figure 8:
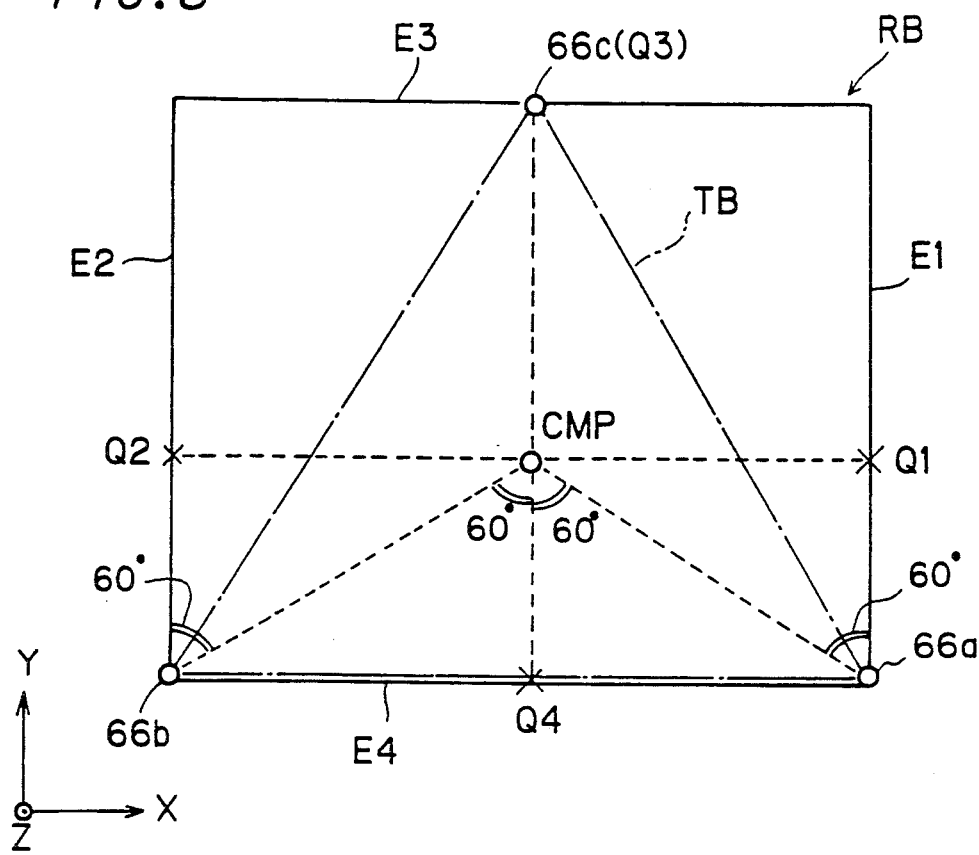
FIG. 8 is a diagram for explaining a way for obtaining a control formula on the piezo actuator.

In such a state of the three-point supporting shown in FIG. 5B, equations representing the dependence of position and angle caused in the stage 56 on voltages u1, u2 and u3 applied to the piezo elements 65a through 65c are determined in the following way. First, as shown in FIG. 8, a triangle TB connecting tips of the pins 66a through 66c and a rectangle RB circumscribing the triangle TB are defined. When amounts of vertical movement of the pins 66a through 66c are identical, the triangle TB is in the horizontal plane and is identical with the equilateral triangle TA in FIG. 5B. For the sake of the following analysis, drawn are four lines from the center of gravity CMP of the triangle TB to four sides E1 through E4 of the rectangle RB so that the lines are perpendicular to the sides E1-E4, respectively. The points or the feet of the perpendiculars at which the perpendicular lines cross the sides E1-E4 are shown in FIG. 8 with reference symbols Q1-Q4. When the stage 56 (not shown in FIG. 8) is inclined from the X-direction by vertical movement of the pins 66a through 66c, a difference in level in the Z-direction between the points Q1 and Q2 is employed as a parameter $X_{f0}$ of the inclination from the X-direction. Similarly, a difference in level in the Z-direction between the points Q3 and Q4 is employed as a parameter $Y_{f0}$ of the inclination of the stage 56 from the Y-direction.

In the preparation as previously mentioned, first, a case in which the stage 56 is uniformly moved horizontally in the Z-direction will be discussed. It is easily understood that this state is obtained by applying to the piezo elements 65a through 65c an identical voltage in proportion to the amount of the horizontal movement.

On the other hand, when the stage 56 is inclined from the X-direction without changing the level of the center of gravity CMP of the triangle TB, the pins 66a through 66c must be driven vertically under the following condition (2):

$$(F1+F2+F3)/3 = C_0 \quad (C_0 = \text{constant}) \tag{2}$$

where F1-F3 represent the amounts of the vertical movement of the pins 66a-66c, respectively.

As seen in FIG. 8, the inclination of the triangle TB from the X-direction can be implemented by driving the pins 66a and 66b, and the amount F1 of the vertical movement of the pin 66a is equivalent to the amount of vertical movement at the point Q1 represented by the expression (3):

$$F1 \cdot \sin 60° \tag{3}$$

Similarly, when the amount F2 of the vertical movement of the pin 66b is equivalent to the amount of the vertical movement at the point Q2 represented by the expression (4):

$$F2 \cdot \sin 60° \tag{4}$$

Thus, the parameter $X_{f0}$ of the inclination from the X-direction is expressed as follows:

$$X_{f0} = F1 \cdot \sin 60° - F2 \cdot \sin 60° \tag{5}$$

On the other hand, when the stage 56 is inclined from the Y-direction, the amount F3 of the vertical movement of the pin 66c equals to the amount of the vertical movement at the point Q3, and the amounts F1 and F2 of the vertical movements of the pins 66a and 66b are equivalent to the amount of the vertical movement at the point Q4 represented by the expressions (6) and (7), respectively.

$$F1 \cdot \cos 60° \tag{6}$$

$$F2 \cdot \cos 60° \tag{7}$$

Then, the following formula (8) is obtained:

$$Y_{f0} = F3 - F1 \cdot \cos 60° - F2 \cdot \cos 60° \tag{8}$$

When the equations (2), (5) and (8) are solved for F1 through F3, the solution (9)–(11) is obtained.

$$F1 = X_{f0}/\sqrt{3} - Y_{f0}/3 + C_0 \tag{9}$$

$$F2 = -X_{f0}/\sqrt{3} - Y_{f0}/3 + C_0 \tag{10}$$

$$F3 = 2Y_{f0}/3 + C_0 \tag{11}$$

The amounts F1 through F3 of the vertical movements of the pins 66a through 66c are in proportion to expansion and shrink amounts of the piezo elements 66a through 66c, and a proportional coefficient is expressed as $A_0$. Therefore, the following expressions (12)–(14) are obtained.

$$F1 = A_0 \cdot u1 \tag{12}$$

$$F2 = A_0 \cdot u2 \tag{13}$$

$$F3 = A_0 \cdot U3 \tag{14}$$

Values $X_f$, $Y_f$ and C are then defined by dividing the parameters $X_{f0}$ and $Y_{f0}$ and the level $C_0$ of the triangle TB in the Z-direction by the coefficient $A_0$, respectively, so that the expressions (15)–(17) are obtained.

$$X_{f0} = A_0 X_f \tag{15}$$

$$Y_{f0} = A_0 Y_f \tag{16}$$

$$C_0 = A_0 C \tag{17}$$

When the formulae (12) through (17) are substituted for the quantities in respective left hand sides of the formulae (9) through (11) and then the formulae (9) through (11) are divided by the coefficient $A_0$, the following formulae are obtained:

$$u1 = X_f/\sqrt{3} - Y_f/3 + C \tag{18}$$

$$u2 = -X_f/\sqrt{3} - Y_f/3 + C \tag{19}$$

$$u3 = 2Y_f/3 + C \tag{20}$$

The formulae (18) through (20) are the basic formulae of an inclination control.

<C. Electrical Structure>

Referring back to FIGS. 2A-2C, the inspection system 100 includes a computer 81 and an I/O port 80. The computer 81 includes a CPU 82, a ROM 83 and a RAM 84 and performs controls and calculations mentioned below. Lighting command signals to a lighting circuit 32 for the halogen lamp 21 and a lighting circuit 33 for the laser diode 24 are also generated in the computer 81.

The output signals of the one-dimensional PSD 28 and the two-dimensional PSD 29 are converted into voltage signals by current-voltage converters 34 and 35, and thereafter, taken by the computer 81 through a multiplexer 36 and an A/D converter 37. Drive command signals u1 through u3 for the piezo elements 65a through 65c (FIG. 5B) are outputted from the computer 81 to piezo drivers 42a-42c through D/A converters 41a through 41c. The piezo drivers 42a through 42c supply drive-voltages to the piezo elements 65a through 65c in accordance with the piezo drive-command signals u1 through u3.

The computer 81 controls the motor 63 for driving the X-Y stage 60 through an X-Y stage controller 43 and an X-Y stage driver 44. The computer 81 is also adapted to control rotation of the pulse motor 54 through a pulse motor controller 45 and a pulse motor driver 46.

<D. Operation>

Figure 9:
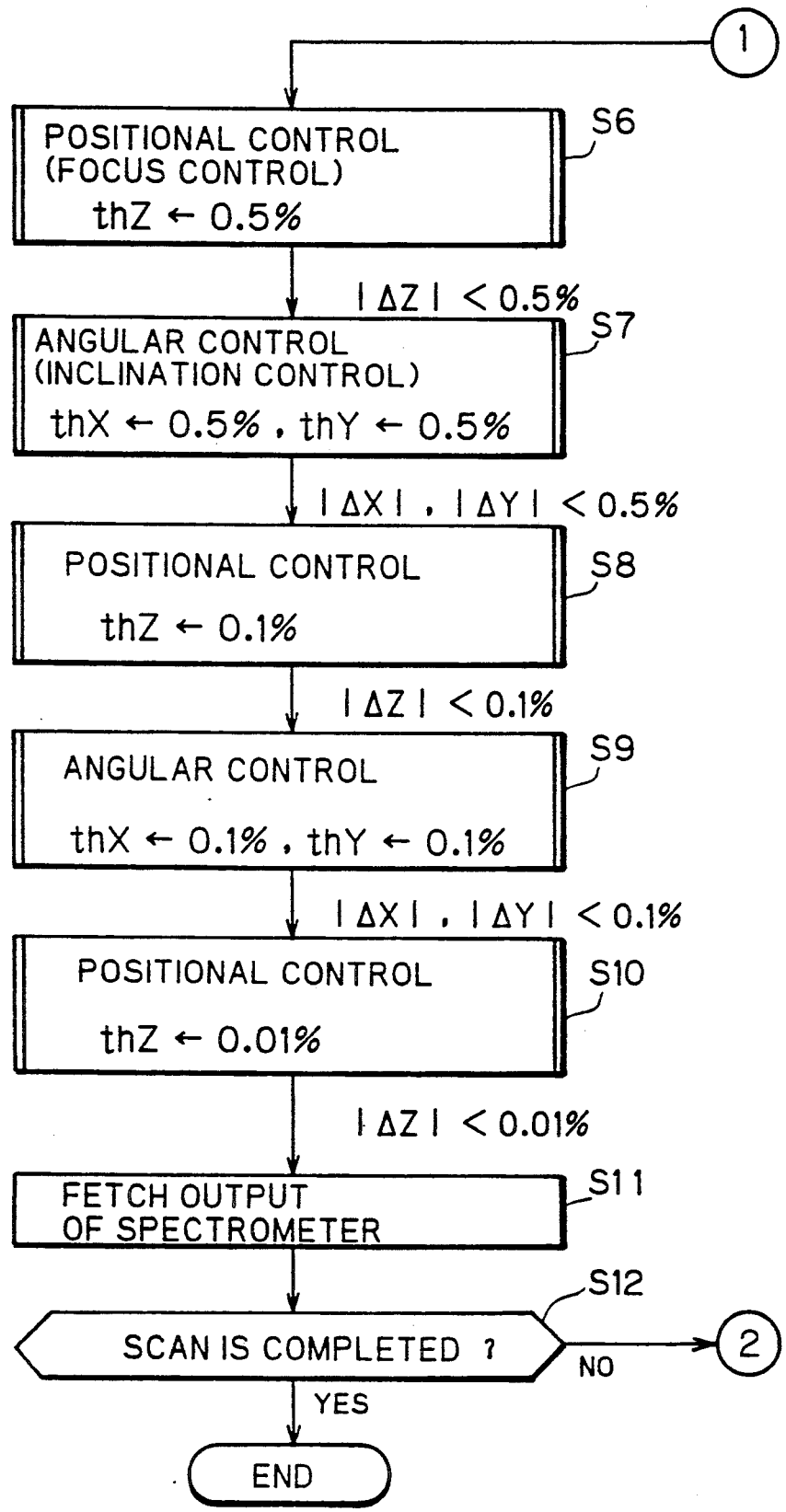
FIG. 9 is a flow chart showing an operation in the preferred embodiment.

FIG. 9 is a flow chart showing a throughout operation of the inspection system 100. At the process step S1, coefficient values $K_X$, $K_Y$, $K_Z$, $K_O$ and $MK_Z$ required for controls mentioned below are set in the computer 81.

At the process step S2, control-target values IPX, IPY, IPZ for the controls of the positional and angular deviations are set in the computer 81. The control-target values IPX, IPY and IPZ are normalized coordinate values of the center of gravity (mentioned below) calculated based upon output values which are obtained from the SPDs 28, 29 when the inspected plane is perpendicular to the optical axis of the inspection light L1 and adjusted to the focal point. The control-target values are, for example, determined in the following way: First, the light L1 is directed to the inspected plane and focused visually. Since the light L2 enters the spectroscope 16, an angle of the stage 56 or the inspected plane can be regulated while monitoring the output of the spectroscope 16 so that the intensity of the light L2 becomes the maximum. Through this process, the inspected plane becomes perpendicular to the light L1 and adjusted to the focal point. After that, a monochrome light is generated from the laser diode 24 to obtain the first and second divided light beams BD1 and BD2. The control-target values IPX, IPY and IPZ are obtained on the basis of the outputs of the PSDs 28 and 29 through a calculation which will be described later.

Then, at the process step S3, a count value n for giving the number of activation of the control loop is set at "0". At the process step S4, amounts of extension or shrinkage P1 through P3 of the piezo elements 65a through 65c at that time are stored as initial values u1(n), u2(n) and u3(n) of the drive command values for n=0.

Figure 10:
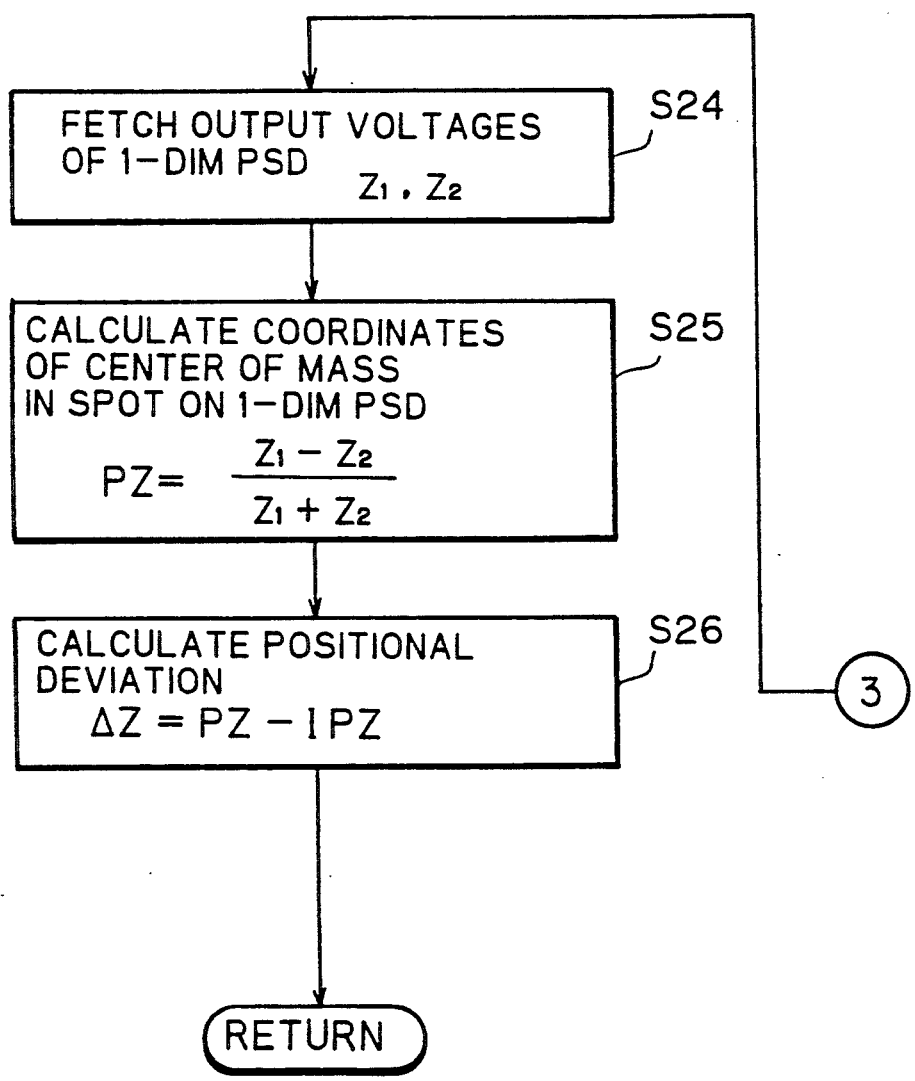
FIG. 10 is a flow chart showing a deviation measuring routine.

At the process step S5, the angular deviations ΔX and ΔY, and the positional deviation ΔZ of the inspected plane to the reference plane RP (see FIGS. 4A through 4D) are obtained based upon the output signals of the PSDs 28 and 29. Details of this step are shown in FIG. 10. First, in the process step S21, the output signals $X_1$, $X_2$, $Y_1$ and $Y_2$ of the two-dimensional PSD 29 are fetched, and in the next process step S22, the coordinates (PX, PY) of a normalized gravity center of the beam receiving position on the light receiving surface 29S are calculated according to the following formulae:

$$PX = \{(X_2+Y_1)-(X_1+Y_2)\}/G \quad (21)$$

$$PY = \{(X_2+Y_2)-(X_1+Y_1)\}/G \quad (22)$$

$$G = X_1 + X_2 + Y_1 + Y_2 \quad (23)$$

When the beam receiving position exists in the center of the light receiving surface 29S, the following conditions are satisfied:

$$PX = PY = 0 \quad (24)$$

Then, at the process step S23, the amounts ΔX and ΔY expressing angular deviations from the control-target values IPX and IPY are calculated:

$$\Delta X = PX - IPX \quad (25)$$

$$\Delta Y = PY - IPY \quad (26)$$

At the process step S24, the output voltages $Z_1$ and $Z_2$ of the one-dimensional PSD 28 are fetched. Then, the following coordinate PZ of the normalized gravity center of a light spot in the light receiving surface 28S are calculated (the process step S25);

$$PZ = (Z_1 - Z_2)/(Z_1 + Z_2) \quad (27)$$

and the following amount ΔZ expressing a positional deviation is obtained:

$$\Delta Z = PZ - IPZ \quad (28)$$

Referring back to FIG. 9, the sequential process steps S6 through S10 correspond to an alternate execution routine of the positional and angular controls of the inspected plane. As previously mentioned, a control efficiency is enhanced as the whole by executing the positional control prior to the angular control. Therefore, in this preferred embodiment, the positional control is executed prior to the angular control.

Figure 13A:
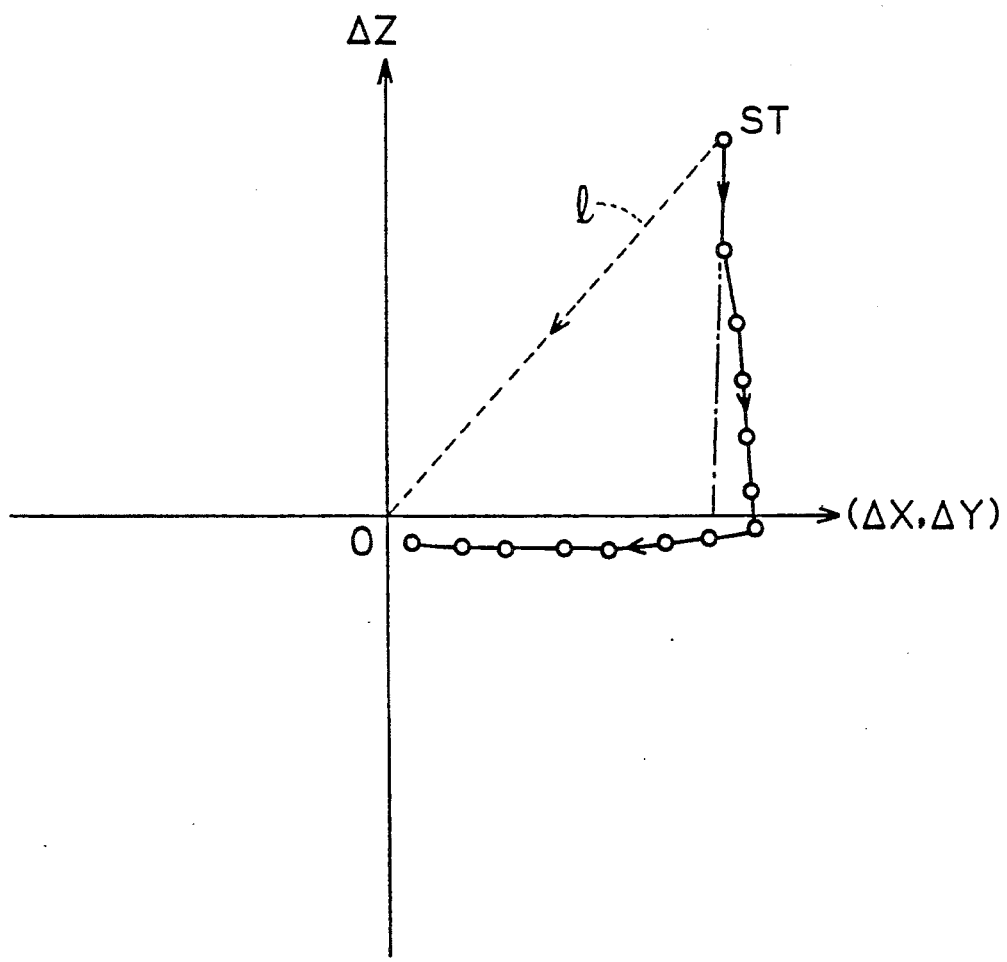
FIGS. 13A and 13B are deviation plan views in which a reduction of a deviation from a focal state due to the execution order of the positional and angular controls is shown in the form of control loci.
Figure 13B:
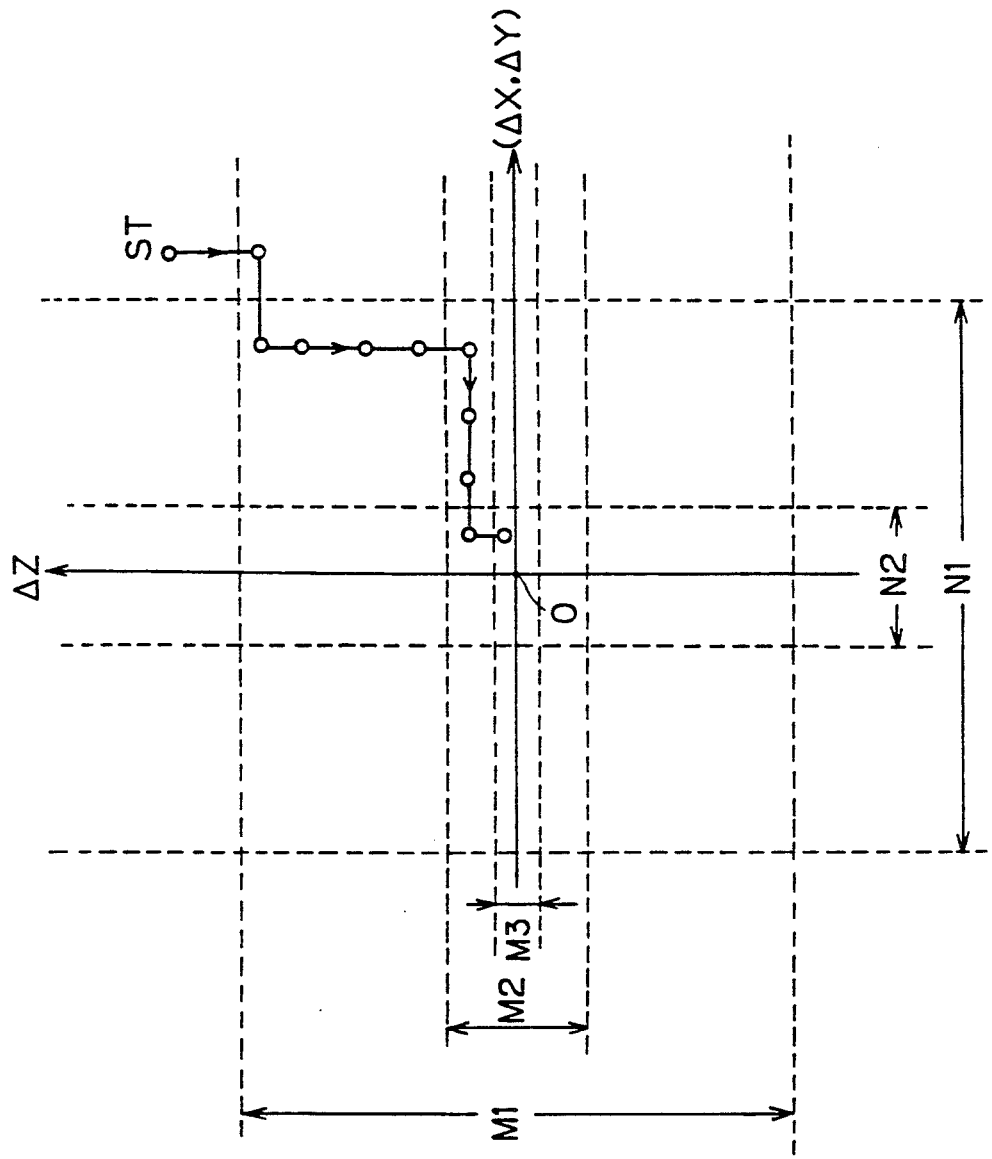

As shown in FIG. 13A as a schematic deviation coordinate plane, when the angular control is executed after a reduction of the positional deviation ΔZ to zero or a value near zero, a control locus comes to considerably deviate from the shortest locus l from the initial state ST to the control-target point O, so that control stability is lowered and a deviation of the control locus as shown in FIG. 13A arises. In some cases, the locus may diverge without converging to the control-target point O. Therefore, in this preferred embodiment, as shown in FIG. 13B with broken lines, a plurality of allowable error sections M1-M3 and N1-N2 each including the control-target point O are defined in lateral and vertical directions on the deviation coordinate plane. The sections M1 through M3 defined along the ΔZ axis become narrower in this order, and the sections N1 and N3 defined along the (ΔX, ΔY) axis also become narrower in this order. When a phase point defined for indicating positional and angular deviations comes into the section M1 through the positional control, the positional control is interrupted and the angular control is started and performed until the phase point enters the section N1. Thereafter, the angular control is stopped and the positional control is resumed. The positional control is continued until the phase point enters the section M2. Similar process is repeated, and when the phase point enters the central cell defined by the sections M3 and N2, the control is stopped. In such a way, the divergence of the control operation is prevented, while the control locus becomes stepwise as shown in FIG. 13B with a chain of arrows, which is in a close resemblance to the shortest locus l shown in FIG. 13A. As a result, the speed and accuracy in control are improved as a whole.

The process steps S6 through S10 in FIG. 9 correspond to such an alternate control. A couple of threshold parameters (thX, thY) defined therein are variables to determine widths of the sections N1 and N2 in FIG. 13B. A threshold parameter thZ is a variable for determining widths of the sections M1 through M3 in the ΔZ-axis direction. These threshold parameters may have values expressed in % in accordance with the condition that the coordinates (PX, PY, PZ) of the gravity center have the normalized values (see the process steps S22 and S25 in FIG. 10).

Figure 11:
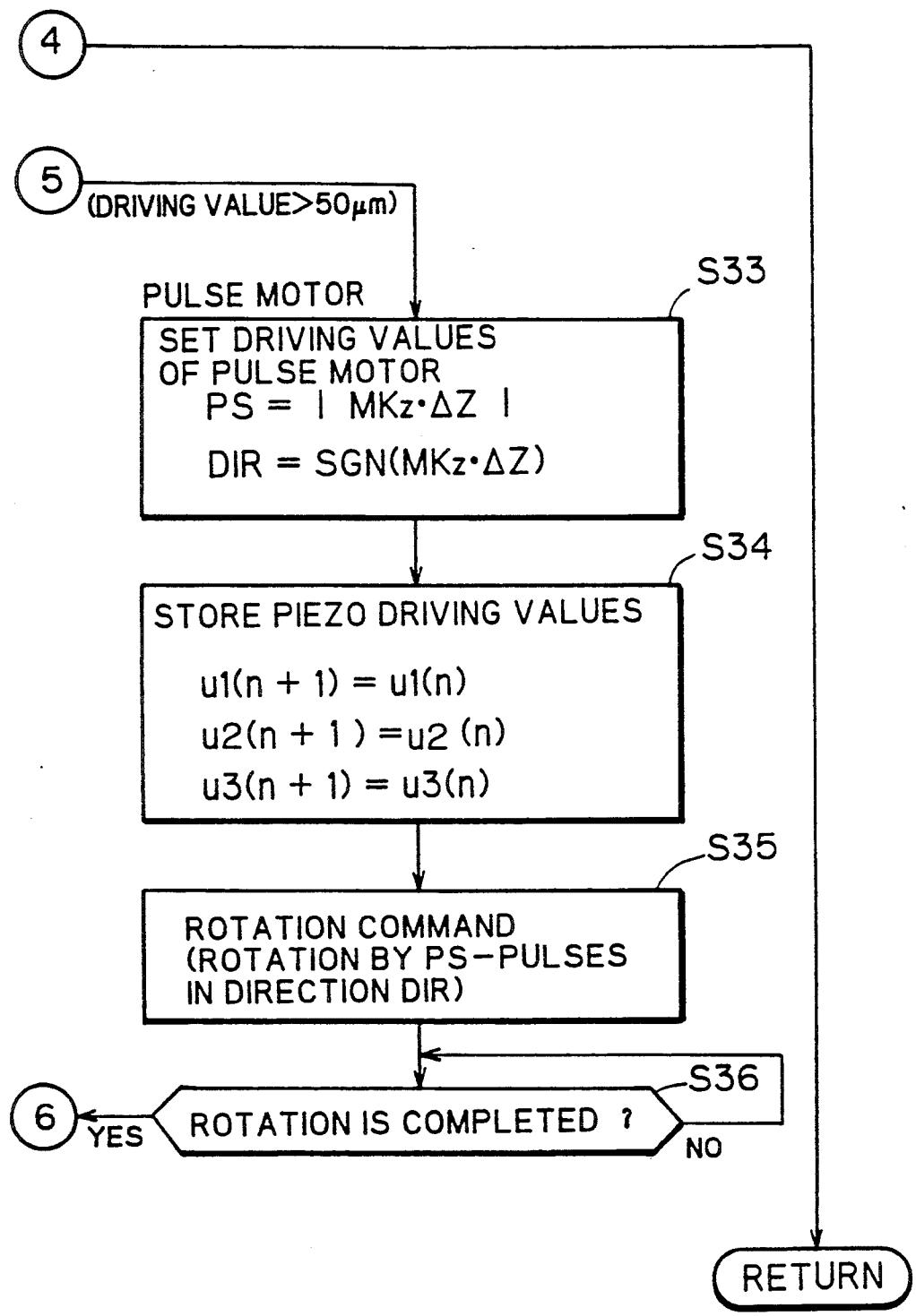
FIG. 11 is a flow chart showing a positional control or a focusing control.

At the process step S6 of the initial positional control, the threshold value thZ is set at 0.5%, and a subroutine in FIG. 11 is executed. First, the absolute value of the positional deviation ΔZ and the threshold value thZ at that time are compared with each other (the process step S31). If the positional deviation ΔZ is larger, the operation proceeds to the process step S32.

In inspection systems as in this embodiment, an electrical system and a mechanical system may include various errors. Hence, it is practical to set a control-target value to a small and non-zero value instead of setting the control-target value just to "0". The control in this embodiment is conducted until the positional deviation becomes to a value less than "0.01%" and the angular deviation becomes to a value less than "0.1%".

In the coefficients which are set at the process step S1 in FIG. 9, the coefficient $MK_Z$ is a proportional coefficient in a proportional control (P control) of the pulse motor 54. Hence, when the pulse motor 54 is employed for moving the inspected plane to reduce the positional deviation ΔZ, it is calculated according to the following formula how many pulses are to be outputted to the pulse motor 54:

$$PS = |MK_Z \cdot \Delta Z| \tag{29}$$

The pulse motor 54, and rack and pinion mechanisms 53 and 55 employed in this embodiment are designed so that the X-Y stage 60 are vertically moved by 0.1 μm per pulse. Thus, assuming that a switching threshold value about whether a positional control in the Z-direction is performed using the pulse motor 54 or the piezo actuators 64a through 64c is set at 50 μm, it is judged in the process step S32 whether the value PS calculated according to the above formula (29) is more than 500 (=50/0.1).

When the value PS is more than 500, the value PS is set as an amount of output pulses to the pulse motor 54 at the process step S33, while a rotation direction DIR of the pulse motor 54 is determined depending upon a positive or negative sign of the amount before taking the absolute value in the formula (29).

At the process step S34, new piezo-driving amounts u1(n+1), u2(n+1) and u3(n+1) are defined using the current piezo-driving amounts u1(n), u2(n) and u3(n), respectively. This is for preventing a situation where the values of u1(n+1), u2(n+1) and u3(n+1) are not defined when the count value n turns to (n+1) in the next repeat loop.

After storing the values u1(n), u2(n) and u3(n) in the form of the values of u1(n+1), u2(n+1) and u3(n+1) through the process step S34, PS-pulses are outputted to the pulse motor 54 (the process step S35) for rotation thereof in the DIR-direction. The coarse regulation in a positional control is completed with this rotation of the motor 54. Then, the operation proceeds from the process step S36 to the process step S39. At the process step S39, the deviation amounts ΔX, ΔY and ΔZ are detected again by executing the subroutine in FIG. 10. Furthermore, after incrementing the count value n at the process step S40, the operation returns to the process step S31.

As the coarse regulation is completed, the operation proceeds from the process steps S31 and S32 to the process step S37 to conduct a fine regulation of the inspected plane with the piezo actuators 64a through 64c. In the positional control, a proportional control according to the following formulae (30) through (32) is employed:

$$u1(n+1) = u1(n) + K_Z \cdot \Delta Z \tag{30}$$

$$u2(n+1) = u2(n) + K_Z \cdot \Delta Z \tag{31}$$

$$u3(n+1) = u3(n) + K_Z \cdot \Delta Z \tag{32}$$

Thus, after these values are calculated at the process step S37, the values u1(n+1), u2(n+1) and u3(n+1) are outputted to the piezo drivers 42a through 42c, respectively, to activate the piezo actuators 64a through 64c.

Such drive of the piezo actuators 64a through 64c is repeated until the absolute value |ΔZ| of the positional deviation becomes the threshold value thZ (=0.5) or under. When the following condition:

$$|\Delta Z| < thZ \tag{33}$$

is satisfied and the phase point in FIG. 13B comes into the section M1, the positional control is interrupted.

Figure 12:
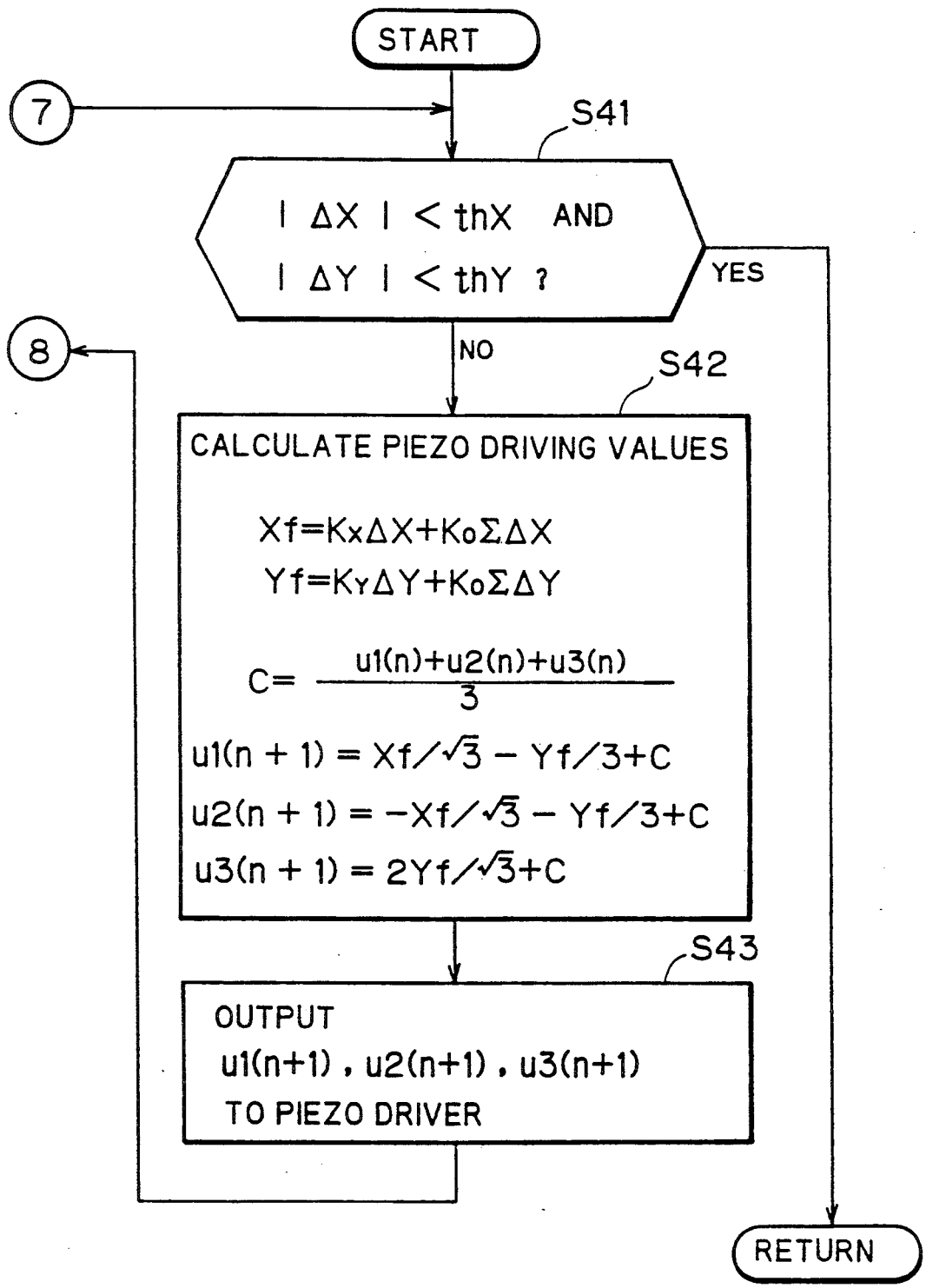
FIG. 12 is a flow chart showing an angular control or an inclination-angle control.
Figure 12:
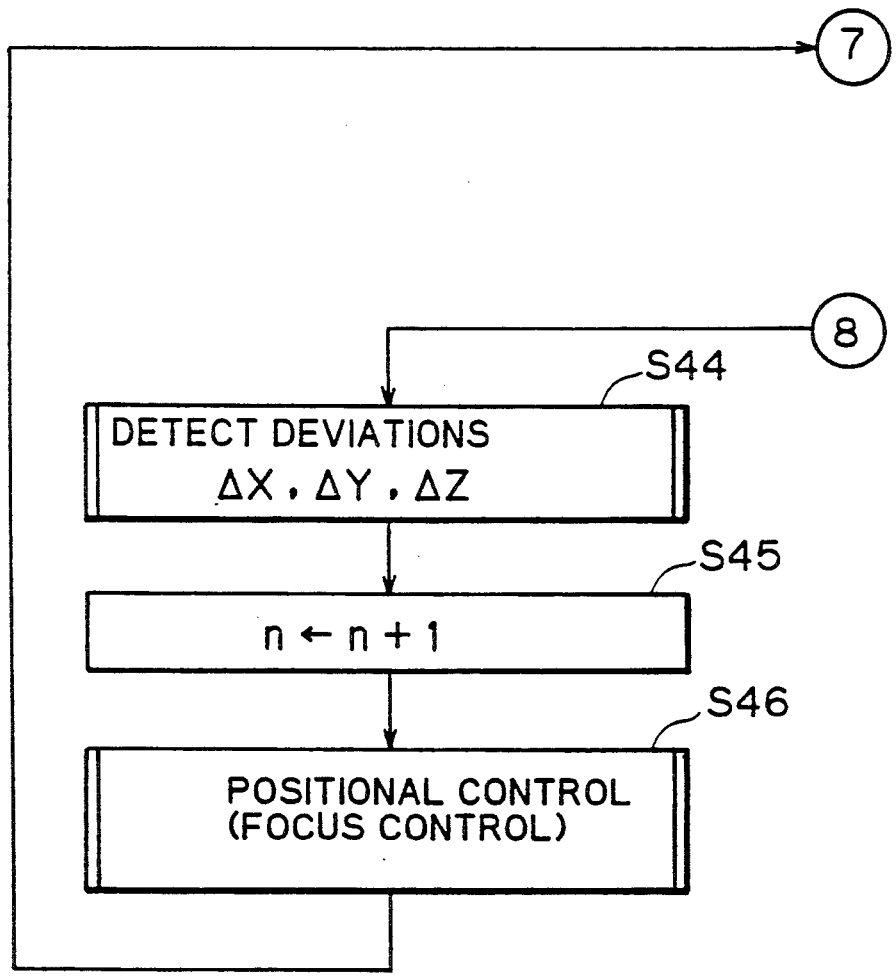

At the process step S7 in FIG. 9, both the threshold values thX and thY are set at 0.5% for the first angular control, and the operation proceeds to a subroutine in FIG. 12. At the process step S41 in FIG. 12, it is judged whether the absolute values of the angular deviations ΔX and ΔY are smaller than the threshold values thX and thY. When at least one of them equals the threshold value thX, thY or over, the operation proceeds to the process step S42.

At the process step S42, the driving-amounts of the piezo elements 65a through 65c are calculated, where a combination of a proportional control with an integral control, namely, a PI control, is performed. This is for taking hystereses of the piezo elements 65a through 65c into consideration. More particularly, the parameter values $X_f$ and $Y_f$ are calculated according to the following formulae:

$$X_f = K_X \Delta X + K_O \Sigma \Delta X \tag{34}$$

$$Y_f = K_X \Delta Y + K_O \Sigma \Delta Y \tag{35}$$

where the symbol Σ in the formulae (34) and (35) indicates the sum of the positional deviation ΔX (or ΔY) from the count value (n−m) to n and where m is a positive integer. Thus, the values of the deviations ΔX and ΔY detected at each control step are stored sequentially from the last one to the value for m steps before.

When the parameter values $X_f$ and $Y_f$ are determined in this way, a value of the amount C is calculated according to the following formula (36):

$$C = (u1(n) + u2(n) + u3(n))/3 \tag{36}$$

The formula (36) is an equation representing the condition that the Z coordinate value is constant, and is obtained by rewriting the formula (2) using the formulae (12) through (14) and (17), dividing both sides thereof with $A_O$ and replacing u1, u2 and u3 with u1(n), u2(n), and u3(n), respectively. The piezo-driving amounts are obtained through a calculation according to the following equations (37)–(39) which are obtained by replacing u1, u2 and u3 in the formulae (18)–(20) with u1(n1), u2(n1) and u3(n1), respectively.

$$u1(n + 1) = X_f/\sqrt{3} - Y_f/3 + C \quad (37)$$

$$u2(n + 1) = -X_f/\sqrt{3} - Y_f/3 + C \quad (38)$$

$$u3(n + 1) = 2Y_f/3 + C \quad (39)$$

Then the results are outputted in the process step S43 to the piezo drivers 42a through 42c, respectively. Thereafter, the deviation amounts ΔX, ΔY, and ΔZ are detected to update their respective values (the process step S44). Then the count value n is incremented (the process step S45).

At the process step S46, a positional control (focus control) is performed. This is performed to return the absolute values of the positional deviations ΔX and ΔY to values equal to the threshold values thX and thY or under, when the positional deviations ΔX and ΔY are changed by the drive of the piezo elements 65a through 65c for the angular control. Through this process, a control efficiency in the next angular control repetitive step is enhanced. The process step S46 is attained through the above-mentioned subroutine in FIG. 11. After that, the operation returns to the process step S41, and the process steps S41 through S46 are repeated until both the following conditions (40) and (41) are satisfied.

$$|\Delta X| < thX \quad (40)$$

$$|\Delta Y| < thY \quad (41)$$

Thus, in this embodiment, implemented is a combination control in which the value of the positional deviation signal ΔZ is updated by sampling signals $Z_1$ and $Z_2$ each time the repeat loop in FIG. 12 is executed, and the positional control is executed each time the update is carried out. Performing the positional control in the repetition of the angular control loop is based upon the above-mentioned principle that it is preferred to reduce the positional deviation prior to the angular deviation.

When the conditions in formulae (40) and (41) are satisfied, i.e., when the phase point in FIG. 13B comes into the section N2, the angular control is interrupted. Then, the positional control is resumed at the process step S8 in FIG. 9. The process step S8 is also executed through the subroutine in FIG. 11, but this time the value of the threshold value thZ is set at 0.1%. After that, the threshold values thX and thY are set at 0.1% and the second angular control is performed through the subroutine in FIG. 12 (the process step S9). Then, the threshold value thZ is set at 0.01% and the positional control is performed (the process step S10). The sequential positional-angular controls are now completed. At this time, the phase point in FIG. 13B comes into the central cell defined by the sections M3 and N2 and becomes close to the control-target point, whereby a state capable of inspection at high accuracy is obtained.

Then, at the process step S11, a timing signal T1 in FIG. 2B is applied to the data processing device 31, and thereby a detection signal SD of the spectroscope 16 is taken by the data processing device 31. When a scanning of the wafer surface WS is not completed, the operation proceeds from the process step S12 to the process step S13 in which a command signal SC is outputted to the X-Y stage controller 43 in FIG. 2C and the X-Y stage 60 is moved in the X- or Y-direction by a predetermined pitch.

When the movement is completed, the operation is returned to the process step S3, and sequential positional-angular controls are repeated. In this way, an intermittent movement and the positional-angular controls of the X-Y stage 60 are repeated, and the output SD from the spectrograph 16 is repeatedly taken in. Thus, the overall region of the surface of the wafer surface WS to be inspected is fully inspected.

<E. Modifications>

(1) The pins 66a through 66c may be arranged in another type of triangle such as an equilateral right triangle. The movement of the X-Y stage 60 in the X-Y directions may be manually performed.

(2) The positional-angular relations between the objective lens 11 and the wafer surface WS are relative, and hence, the driving means for a positional feedback may be connected to the lens-barrel 10, or the optical head, so that it can vertically move the lens-barrel 10 together with the objective lens 11. The driving means may be connected to both the lens-barrel 10 and wafer supporting mechanism, wherein a drive of the lens-barrel 10 may be performed for a coarse regulation while a fine regulation may be performed on the side of the wafer as in the above-mentioned embodiment. However, the configuration as in the above-mentioned embodiment has a higher drive accuracy. This modification is applicable also to the angular control.

(3) The present invention can be applied not only to an inspection of a surface of a semiconductor wafer but to inspections of various fine processed planes and the like.

(4) In the above-mentioned embodiment, on setting the desired values in control IPX and IPY, the reference plane RP in FIG. 4A is perpendicular to the optical axis. Similarly, it is also possible to make the reference plane RP inclined at a minute angle a target of the control.

<F. Conclusion>

As has been described, in the present invention, a positional control system and an angular control system share their respective parts with each other, so that the number of parts of which the device is composed is reduce. The device is made smaller in size, and processes of an assemblage and a regulation may be simplified.

A single light beam is divided into parts utilized for a positional control and an angular control. Therefore, a positional deviation and an angular deviation are detected from light reflection information from an identical area of a surface of an inspected object. It is never caused that the two kinds of deviations are detected in different areas, so that a control accuracy is reduced. Thus, a control accuracy as the whole is enhanced.

On the other hand, the positional control is performed prior to the angular control in accordance the property that the detection of the angular deviation is easily affected by the positional deviation. Correspondingly, detection accuracy of the angular deviation in the angular control is enhanced. As a result, a convergence to the desired value is quickened.

The positional and angular controls are alternately performed, while allowable errors in the controls are reduced in a stepwise manner, so that a convergence is further quickened as the whole.

The positional control is performed each time a repetitive step in the angular control is performed, so that a convergence to the desired value is more quickened.

Although the present invention has been described and illustrated in detail, it is clearly understood that the same is by way of illustration and example only and is not to be taken by way of limitation. The spirit and scope of the present invention should be limited only by the terms of the appended claims.

We claim:

1. A method of focusing an optical head on an object body, wherein said optical head comprises an objective lens having a first focal point on an optical axis thereof, said method comprising the steps of:
   (a) emitting a light beam substantially being a parallel ray;
   (b) directing said light beam to said object body through said objective lens, said light beam reflecting on a surface of said object body, thereby to obtain a reflected light beam of said light beam;
   (c) dividing said reflected light beam into first and second divided light beams after said reflected light beam passes through said objective lens;
   (d) forming a light spot of said first divided light beam with an imaging lens having a second focal point;
   (e) detecting a one-dimensional position of said light spot on a first plane which includes said second focal point, thereby to obtain a first position value indicative of said one-dimensional position of said light spot;
   (f) obtaining a positional deviation value representing a positional deviation of the surface of said object body from said first focal point of said objective lens on the basis of said first position value;
   (g) detecting a two-dimensional position of said second divided light beam on a second plane associated with said optical axis of said objective lens, thereby to obtain a second position value indicative of said two-dimensional position of said second divided light beam;
   (h) obtaining an angular deviation value representing an angular deviation of the surface of said object body from a reference plane orthogonal to said optical axis of said objective lens on the basis of said second position value;
   (i) obtaining movement amounts for reducing both said position deviation and said angular deviation as a function of said positional deviation value and said angular deviation value; and
   (j) moving at least one of said optical head and said object body on the basis of said movement amounts.

2. The method of claim 1, further comprising the step of:
   (k) repeating the steps (a) through (j) until said position deviation value and said angular deviation value become smaller than predetermined allowable deviation values, respectively.

3. The method of claim 2, wherein the detection of said two-dimensional position of said second divided light beam in the step (g) is accomplished by detecting a gravity position of said second divided light beam on said second plane.

4. The method of claim 3, wherein the steps (i) and (j) comprise the steps of:
   (i-1) obtaining a position movement amount for reducing said position deviation;
   (j-1) moving at least one of said optical head and said object body on the basis of said position movement amount;
   (i-2) after the step (j-1), obtaining an angular movement amount for reducing said angular deviation; and
   (j-2) moving said object body on the basis of said angular movement amount.

5. The method of claim 4, further comprising the step of providing a position allowable deviation value and an angular allowable deviation value,
   wherein the steps (i-1) and (j-1) are repeated until said position deviation value become smaller than said position allowable deviation value, and
   wherein the steps (i-2) and (j-2) are repeated until said angular deviation value become smaller than said angular allowable deviation value.

6. The method of claim 5, wherein the step (i-2) and (j-2) further comprises the steps of:
   detecting and compensating said position deviation whenever the step (j-2) is executed.

7. The method of claim 6, further comprising the steps of:
   providing allowable deviation pairs of position allowable deviation values and angular allowable deviation values, and
   repeatedly executing the step (k) while selecting one of said allowable deviation pairs at each execution thereof.

8. The method of claim 7, wherein one of said allowable deviation pairs is selected in order of large value.

9. An automatic focusing device employed in an optical inspection system in which an object body supported with supporting means is inspected through an objective lens built in an optical head, said device comprising:
   (a) driving means coupled to at least one of said supporting means and said optical head, for varying relative positional and angular relations between said object body and said objective lens;
   (b) light beam generating means for generating a first light beam substantially being a parallel ray and for directing said first beam to said objective lens, wherein said first light beam incident on said object body through said objective lens is reflected at said object body to become a second light beam;
   (c) light dividing means for dividing said second light beam into first and second divided light beams after said second light beam returns through said objective lens;
   (d) an imaging lens positioned in an optical path of said first divided light beam;
   (e) one-dimensional photo-sensing means having a first light receiving surface positioned in a focal point of said imaging lens, for detecting a one-dimensional position of a light spot of said first divided light beam on said first light receiving surface;
   (f) positional deviation signal generating means for generating a positional deviation signal representing a positional deviation of an inspected plane in said object body from a focal point of said objective lens based upon an output signal of said one-dimensional photo-sensing means;
   (g) two-dimensional photo-sensing means having a second light receiving surface for receiving said second divided light beam, for detecting a two-dimensional position of said second divided light beam on said second light receiving surface;

(h) angular deviation signal generating means for generating an angular deviation signal corresponding to an angular deviation of said inspected plane from a reference plane orthogonal to an optical axis of said objective lens based upon an output signal of said two-dimensional photo-sensing means; and (i) drive control means for generating a drive command signal as a function of said positional deviation signal and said angular deviation signal and for delivering said drive command signal to said driving means to enable said driving means so that said positional deviation and said angular deviation reach values smaller than predetermined allowable deviation values.

10. The device of claim 9, wherein
said two-dimensional photo-sensing means is operable to detect a gravity of said second divided light beam on said second light receiving surface as said two-dimensional position of said second divided light beam.

11. The device of claim 10, wherein
said drive control means comprises:
(i-1) priority control means for conducting a positional control prior to an angular control;
said positional control is a control for varying said relative positional relation; and
said angular control is a control for varying said relative angular relation.

12. The device of claim 11, wherein
said priority control means comprises:
(i-1-1) means for providing a first command value corresponding to said positional deviation signal to said drive command signal to reduce said positional deviation to a value smaller than a predetermined allowable positional deviation value; and
(i-1-2) means for providing a second command value corresponding to said angular deviation signal to said drive command signal to reduce said angular deviation to a value smaller than a predetermined allowable angular deviation value.

13. The device of claim 12, wherein
said drive control means further comprises:
(i-2) repetition means for enabling said priority control means repeatedly, to thereby repeat said positional control and said angular control.

14. The device of claim 13, wherein
said drive control means further comprises:
(i-3) means for reducing said allowable positional deviation value and said allowable angular deviation value by degrees in repetition of said positional control and said angular control.

15. The device of claim 14, wherein
said angular deviation signal generating means further comprises:
(h-1) means for repeatedly sampling an output signal of said two-dimensional photo-sensing means during said angular control to detect said angular deviation at each sampling; and
(h-2) means for sequentially updating a value of said angular deviation signal as a function of said angular deviation detected by said means (h-1); and
said drive control means further comprises:
(i-4) means for executing said position control in accordance with said value of said positional deviation signal whenever said means (h-2) updates said value of said angular deviation signal.

16. The device of claim 15, wherein
said supporting means comprises:
table means having a stage member on which said object body is held; and
said driving means comprises:
(a-1) first actuator means coupled to said table means for moving said table means together with said object body in a direction Z parallel to an optical axis of said first light beam; and
(a-2) second actuator means provided in said table means for moving said stage member in said direction Z and for inclining said stage member together with said object body from an X-Y plane perpendicular to said direction Z.

17. The device of claim 16, wherein
said table means further comprises:
movable table member connected to said first actuator means and movable in said direction Z;
a plurality of piezo electric elements arranged on said movable table member; and
a plurality of pins coupled to said plurality of piezo electric elements, respectively, and on which said stage member is placed, wherein said plurality of piezo electric elements are operable to push up said plurality of pins in response to said drive command signal, respectively.

* * * * *